United States Patent
Kitazaki et al.

(10) Patent No.: US 10,756,024 B2
(45) Date of Patent: Aug. 25, 2020

(54) ELECTRONIC COMPONENT MODULE AND METHOD OF MANUFACTURING THE SAME

(71) Applicant: TAIYO YUDEN CO., LTD., Tokyo (JP)

(72) Inventors: Kenzo Kitazaki, Tokyo (JP); Takehiko Kai, Tokyo (JP); Masaya Shimamura, Tokyo (JP); Mikio Aoki, Tokyo (JP); Jin Mikata, Tokyo (JP); Taiji Ito, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/934,757

(22) Filed: Mar. 23, 2018

(65) Prior Publication Data

US 2018/0286796 A1 Oct. 4, 2018

(30) Foreign Application Priority Data

Mar. 30, 2017 (JP) .................................. 2017-067067

(51) Int. Cl.
*H01L 23/552* (2006.01)
*H01L 23/498* (2006.01)
(Continued)

(52) U.S. Cl.
CPC ...... *H01L 23/552* (2013.01); *H01L 23/49827* (2013.01); *H01L 23/49838* (2013.01);
(Continued)

(58) Field of Classification Search
None
See application file for complete search history.

(56) References Cited

U.S. PATENT DOCUMENTS 5,517,515 A * 5/1996 Spall .............. G01R 31/318536
714/733
6,285,079 B1 9/2001 Kunikiyo
(Continued)

FOREIGN PATENT DOCUMENTS

JP 2009-218484 A 9/2009
JP 2010-212410 A 9/2010
(Continued)

OTHER PUBLICATIONS

Japanese Office Action dated Sep. 11, 2018, in a counterpart Japanese patent application No. 2017-067067. (A machine translation (not reviewed for accuracy) attached.).
(Continued)

*Primary Examiner* — Anthony Ho
*Assistant Examiner* — Kevin Quinto
(74) *Attorney, Agent, or Firm* — Chen Yoshimura LLP

(57) ABSTRACT

An electronic component module includes: a substrate including a conductive pattern; an electronic component provided to the substrate; a sealing portion covering the electronic component and substrate, and having an upper surface and a side surface that form an edge portion; a contact portion configured to be electrically connected with the conductive pattern, the contact portion exposed on a vertical surface continuous with the side surface of the sealing portion; a removal portion formed by removing the predetermined edge portion formed by the upper surface and the side surface of the sealing portion; and a shielding film covering the upper surface, the side surface and the contact portion of the sealing portion. The removal portion is a region allowing a conductive material to pass therethrough so that the contact portion is covered with the shielding film, the conductive material being scattered in vacuum atmosphere lower than atmospheric pressure.

18 Claims, 16 Drawing Sheets

(51) Int. Cl.
*H05K 9/00* (2006.01)
*H05K 5/00* (2006.01)
*H01L 25/16* (2006.01)

(52) U.S. Cl.
CPC .......... *H01L 25/16* (2013.01); *H05K 5/0095* (2013.01); *H05K 9/0081* (2013.01); *H01L 23/49805* (2013.01); *H01L 23/49822* (2013.01); *H01L 2224/16225* (2013.01); *H01L 2224/97* (2013.01); *H01L 2924/1815* (2013.01)

(56) References Cited

U.S. PATENT DOCUMENTS

| | | |
|---|---|---|
| 2004/0238934 A1 | 12/2004 | Warner et al. |
| 2005/0280139 A1 | 12/2005 | Zhao et al. |
| 2006/0249824 A1 | 11/2006 | Lee et al. |
| 2008/0111225 A1 | 5/2008 | Kim et al. |
| 2009/0212401 A1 | 8/2009 | Do et al. |
| 2009/0302439 A1 | 12/2009 | Pagaila et al. |
| 2011/0304015 A1 | 12/2011 | Kim et al. |
| 2012/0015687 A1 | 1/2012 | Yamada et al. |
| 2013/0194756 A1 | 8/2013 | Aso et al. |
| 2015/0016066 A1 | 1/2015 | Shimamura et al. |
| 2015/0171019 A1 | 6/2015 | Otsubo et al. |
| 2015/0171060 A1 | 6/2015 | Goto et al. |
| 2016/0149300 A1 | 5/2016 | Ito et al. |
| 2017/0098637 A1 | 4/2017 | Hamada |
| 2017/0323838 A1 | 11/2017 | Otsubo et al. |
| 2018/0199428 A1 | 7/2018 | Otsubo et al. |
| 2018/0286816 A1 | 10/2018 | Kitazaki et al. |

FOREIGN PATENT DOCUMENTS

| | | |
|---|---|---|
| JP | 2013-58513 A | 3/2013 |
| JP | 2013-161831 A | 8/2013 |
| JP | 2014-146624 A | 8/2014 |
| JP | 2015-115552 A | 6/2015 |
| JP | 2015-115560 A | 6/2015 |
| JP | 2015-233164 A | 12/2015 |
| WO | 2010/103756 A1 | 9/2010 |
| WO | 2015/015863 A1 | 2/2015 |
| WO | 2015/194435 A1 | 12/2015 |
| WO | 2016/121491 A1 | 8/2016 |
| WO | WO-2016121491 A1 * | 8/2016 |
| WO | 2017/043621 A1 | 3/2017 |

OTHER PUBLICATIONS

Japanese Office Action dated Sep. 4, 2018, in a counterpart Japanese patent application No. 2017-067050. (Cited in the related U.S. Appl. No. 15/934,829. A machine translation (not reviewed for accuracy) attached.).

U.S. Appl. No. 15/934,829, filed Mar. 23, 2018.

Japanese Office Action dated Oct. 15, 2019, in a counterpart Japanese patent application No. 2017-067067. (A machine translation (not reviewed for accuracy) attached.).

* cited by examiner

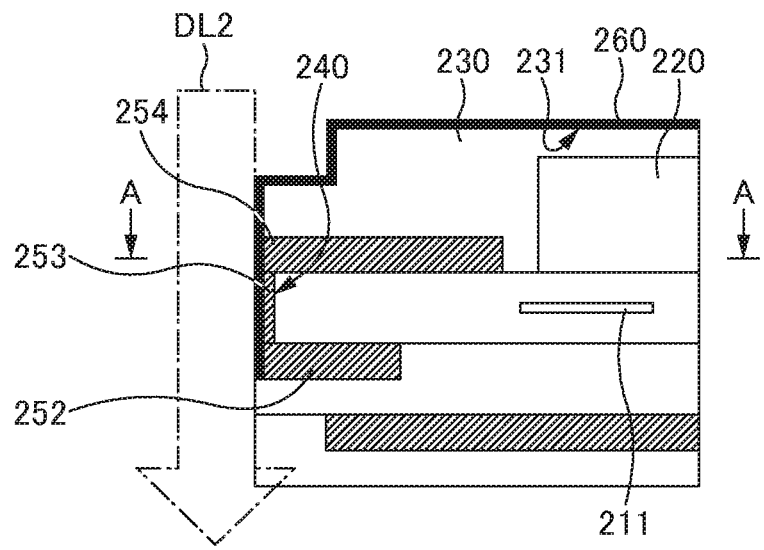
FIG. 14A ENLARGED VIEW OF REGION S
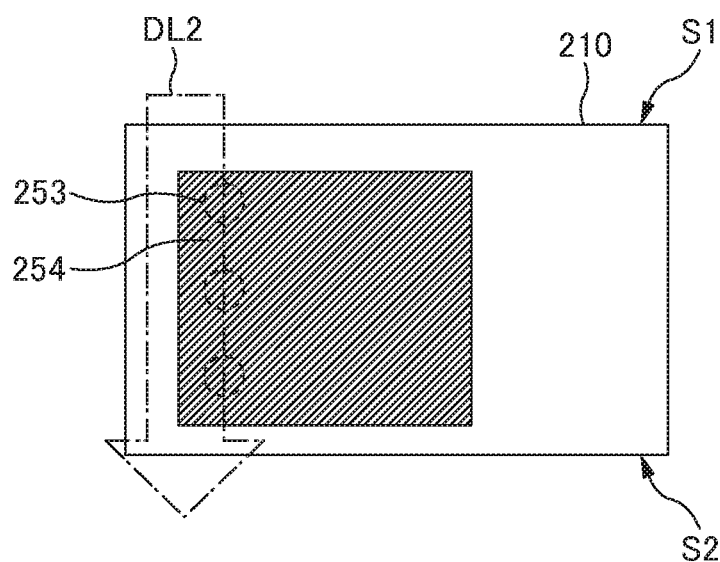
FIG. 14B END VIEW ALONG LINE A-A

ELECTRONIC COMPONENT MODULE AND METHOD OF MANUFACTURING THE SAME

CROSS-REFERENCE TO RELATED APPLICATION

This application claims the benefit of priority to Japanese Patent Application No. 2017-67067, filed Mar. 30, 2017, of which full contents are incorporated herein by reference.

BACKGROUND OF THE INVENTION

Technical Field

The present disclosure relates to an electronic component module and a method of manufacturing the electronic component module.

Background Art

A semiconductor package is known in which an electromagnetic shield is formed on a surface thereof so as to suppress Electro Magnetic Interference (EMI) generated from a semiconductor device. In manufacturing this type of semiconductor devices, for example, a plurality of semiconductor packages obtained by singulation from an assembly substrate is arranged and fixed at predetermined intervals on a carrier, and then a shielding film is formed by a film forming means such as sputtering.

However, it takes time and efforts to arrange and fix such singulated semiconductor packages on the carrier. In addition, since the semiconductor packages are arranged at predetermined intervals on the carrier, productivity is reduced. Furthermore, depending on film forming means, a film forming material goes around to the back surface of the semiconductor package, which causes deterioration in quality. Further, when singulation is performed by a dicing apparatus, the area of a ground electrode exposed on the side surface of a substrate is limited, which results in increase in contact resistance.

Accordingly, an aspect of the present disclosure is to provide an electronic component module capable of forming a shielding film in a state of an assembly substrate and enhancing productivity, and a method of manufacturing the electronic component module.

SUMMARY OF THE INVENTION

An electronic component module according to an embodiment of the present disclosure comprises: a substrate including a conductive pattern; an electronic component provided to the substrate; a sealing portion covering the electronic component and the substrate, the sealing portion having an upper surface and a side surface, the upper surface and the side surface forming an edge portion; a contact portion configured to be electrically connected with the conductive pattern, the contact portion exposed on a vertical surface continuous with the side surface of the sealing portion; a removal portion formed by removing the predetermined edge portion formed by the upper surface and the side surface of the sealing portion; and a shielding film covering the upper surface, the side surface and the contact portion of the sealing portion, the removal portion being a region allowing a conductive material to pass therethrough so that the contact portion is covered with the shielding film, the conductive material being scattered in a vacuum atmosphere lower than an atmospheric pressure.

BRIEF DESCRIPTION OF THE DRAWINGS

FIG. 14A is a schematic diagram illustrating an electronic component module according to a second embodiment where a solid ground is used.

FIG. 14B is a schematic diagram illustrating an electronic component module according to a second embodiment where a solid ground is used.

DETAILED DESCRIPTION

Figure 1A:
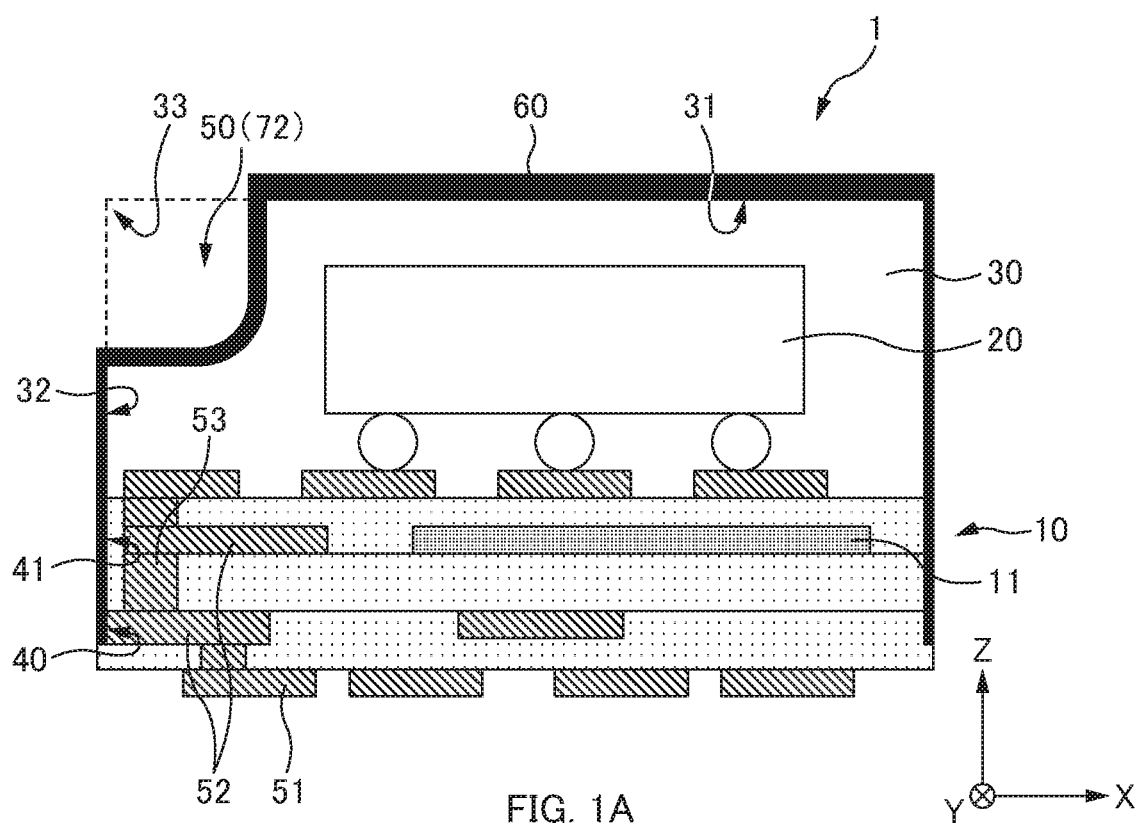
FIG. 1A is a schematic diagram illustrating an electronic component module according to a first embodiment.

Hereinafter, various embodiments of the present disclosure will be described with reference to drawings as appropriate. In the drawings, common or similar components are given the same or similar reference numerals.

A description will be given, hereinafter, using the following coordinate axes for convenience sake. That is, the positive direction of a Z-axis is set to be a vertically upward direction. The positive direction of a Y-axis is set to be orthogonal to the Z-axis as well as a direction from the front to the rear in the drawings. The X-axis is set to be a direction orthogonal to the Y-axis and Z-axis. Accordingly, the upper side and the lower side indicates the positive side and the negative side of the Z-axis, respectively, while the right side and the left side indicates the positive side and the negative side of the X-axis, respectively.

First Embodiment

==Configuration of Electronic Component Module 1==

A configuration of an electronic component module 1 according to a first embodiment will be described with reference to FIGS. 1A, 1B, 2A, and 2B. FIGS. 1A, 1B, 2A, and 2B are schematic diagrams illustrating an electronic component module 1 according to a first embodiment.

Figure 1B:
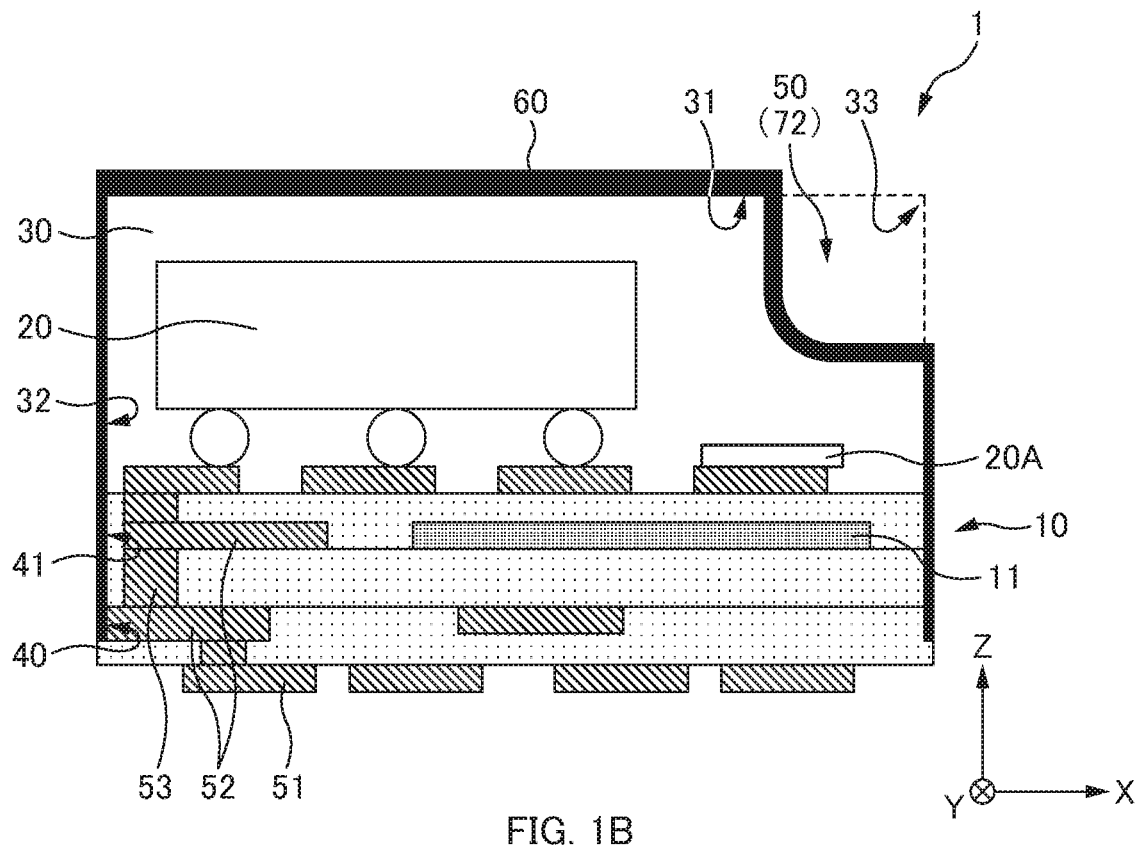
FIG. 1B is a schematic diagram illustrating an electronic component module according to a first embodiment.

The electronic component module 1 includes, as illustrated in FIGS. 1A and 1B, a substrate 10, an electronic component 20, a sealing portion 30, a contact portion 40, a removal portion 50, and a shielding film 60.

The substrate 10 is made of an insulating material, such as resin, alumina, glass, ceramics, a composite material, and includes a conductive pattern 11 (for example, ground wiring, Vcc, etc.) inside thereof. A part of the conductive pattern 11 is configured to be connected with a GND, for example.

The substrate 10 includes a via 53 configured to electrically connect GND wiring patterns formed in different layers to each other. Here, the via 53 may be a through hole provided in an upper layer or a lower layer of an electrode, or such vias 53 may be a via and a through hole. Hereinafter, it is assumed that the vias 53 includes a through hole.

Further, the substrate 10 includes an electrode 52. The electrode 52 may be formed inside (in an inner layer of) the substrate 10, or may be formed on a surface (for example, upper surface) of the substrate 10. It should be noted that the electrode 52 may be ground wiring. Further, the substrate 10 includes, for example, a terminal 51 for connecting the GND, for example, on the lower surface side of the electronic component module 1. Note that a semiconductor material such as Si may be used for the substrate. This is a so-called silicon interposer. A Si substrate has substantially the same coefficient of thermal expansion as an IC to be mounted, and thus has been frequently used recently. A semiconductor device including PN junction may be incorporated in the Si substrate. At least one layer of a conductive pattern is formed on this Si substrate, and such at least one layer thereof is subjected to an insulating process using an inorganic insulation film provided on a lower layer. For example, SiO2, SiNx, or the like is used. For example, the substrate 10 in FIG. 1A is laminated on the Si substrate.

The electronic component 20 is provided, for example, on the upper surface side of the substrate 10. Here, as illustrated in FIG. 1B, the electronic component 20 may include a passive element such as a resistor, inductor, and/or capacitor, in addition to a semiconductor chip. Further, the electronic component 20 may be a filter or the like. As will be described later, assuming that a semiconductor chip is commonly tall while a chip resistor and a chip capacitor are short, an empty space is created above such a short component and can be utilized as a position for the removal portion 50.

The sealing portion 30 is a protective member that covers the electronic component 20 and the substrate 10. The sealing portion is formed using thermosetting resin for molding, such as epoxy resin and cyanate resin. The sealing portion 30 includes an upper surface 31, a side surface 32 extending downward from an edge portion of the upper surface 31. Thus, a connecting portion between the upper surface 31 and the side surface 32 forms an edge portion 33.

The contact portion 40 is a portion having a vertical surface formed with the electrode 52 that is exposed by dicing. Further, the contact portion 40 is configured to be electrically connected to the terminal 51 and the conductive pattern 11. The contact portion 40 is configured to be electrically connected to the GND, for example, through the terminal 51 and/or the conductive pattern 11, via the electrode 52.

The removal portion 50 is formed by removing the edge portion 33 formed by the upper surface 31 and the side surface 32 of the sealing portion 30 (also defined as a connection portion between the upper surface 31 and the side surface 32, or an edge portion of the upper surface 31). The removal portion 50 is a region (space) where a conductive material scattered in a vacuum atmosphere having a pressure lower than atmospheric pressure is allowed to pass therethrough, such that the contact portion 40 is covered with the shielding film 60. In the present embodiment, the edge portion 33 is a virtual area indicated by dotted lines illustrated in FIGS. 1A, 1B, 2A, and 2B is positioned in the vicinity of the upper surface of the sealing portion 30, and is a portion recessed downward or inclined.

Figure 2A:
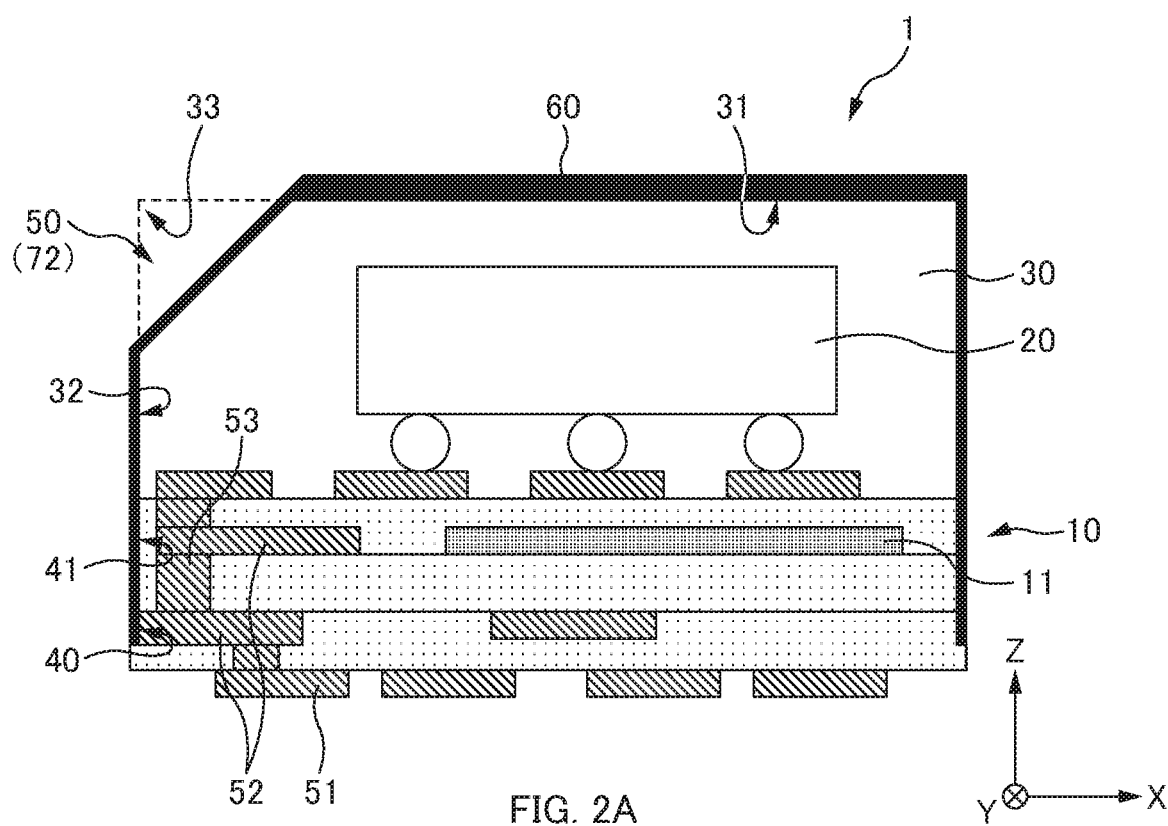
FIG. 2A is a schematic diagram illustrating a modified example of an electronic component module according to a first embodiment.
Figure 2B:
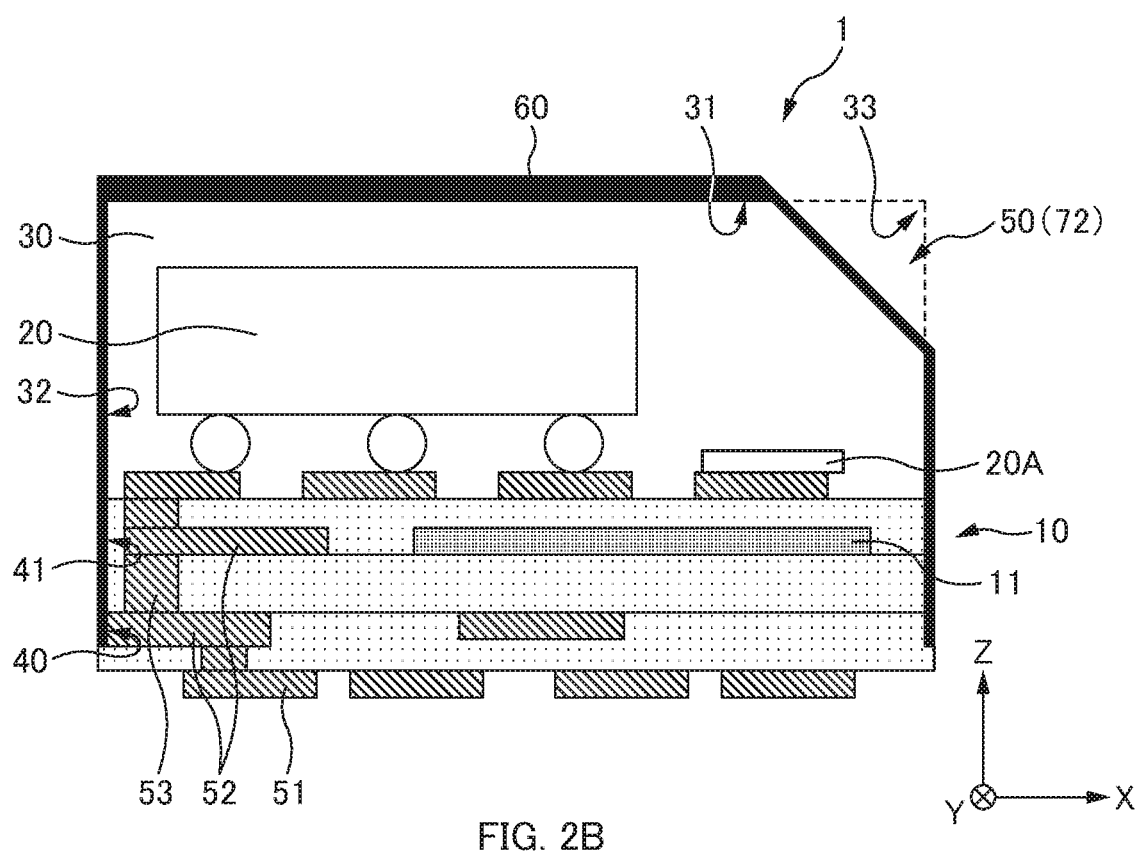
FIG. 2B is a schematic diagram illustrating a modified example of an electronic component module according to a first embodiment.

The removal portion 50 has a shape of a groove, for example, however, it is not limited thereto. The removal portion 50 may be a slope inclined outward as illustrated in FIGS. 2A and 2B (on the negative or positive side in the X-axis in FIGS. 2A and 2B). Hereinafter, the second groove is not limited to the shape as of the removal portion 50 according to the present embodiment, but includes the shape as of a removal portion 50 as illustrated in FIGS. 2A and 2B.

Since the removal portion 50 is formed as such, scattered particles of a conductive material can be allowed to pass through a space (region) of the removal portion 50 in a process of forming the shielding film 60. That is, the removal portion 50 is provided to ensure a space capacity, so that a film is formed thicker on a side surface of a first groove 71 as in FIG. 11. More preferably, the removal portion 50 is formed such that a length (distance) B of the side surface from the bottom surface of the first groove 71 to the bottom surface of the removal portion 50 is twice or smaller with respect to the width A of the first groove 71. Accordingly, by virtue of the provision of the removal portion 50, scattered particles can easily enter the first groove 71, and a thickness of the film can be ensured. This can reduce contact resistance between the contact portion 40 and the shielding film 60.

Further, it is preferable that the removal portion 50 is formed vertically above the electronic component 20. That is, when viewed from the upper surface side, the removal portion 50 is arranged so as to overlaps all or a part of an electronic component 20. With such an arrangement, it is possible to reduce the size and cost of the electronic component module 1.

Thus, even in a case where a space between packages on an assembly substrate 15 (i.e., a width of the first groove 71) is narrow, a sufficient film thickness of the shielding film 60 can be formed on a side surface of such a package. Accordingly, productivity with respect to the electronic component module 1 can be enhanced. It should be noted that, in sputtering or the like, scattering is caused due to Ar, and thus the removal portion 50 may be provided on the side where the contact portion 40 is provided as in FIG. 7B. However, considering the characteristics of scattered matters of traveling in straight lines, as in FIG. 7C, it is preferable to provide the removal portion 50 on the side surface opposed to the side surface where the contact portion 40 is exposed (in the drawing, on the side on which a short element 20A is disposed). FIGS. 1B and 2B illustrate one obtained by forming the shielding film 60 in this state and performing singulation. In this state, due to the contact portion 40, a large number of the scattered matters passing therethrough can reach the contact portion 40 and a film thickness can be secured. In specific, in FIGS. 1B and 2B, since the shielding film 60 is formed to be thicker on the side surface where the contact portion 40 is provided than on the side surface on the side where the removal portion 50 is provided, contact resistance can be reduced.

Vapor deposition, sputtering or CVD is used as the film forming method of forming the shielding film 60. The shielding film 60 is a conductive film that covers the upper surface 31 and the side surface 32 of the sealing portion 30 and the contact portion 40. The shielding film 60 is configured to be electrically connected to the contact portion 40, and suppress an electromagnetic wave generated inside the electronic component module 1 from leaking to the outside. Further, noise from the outside does not enter into the module, either.

The shielding film 60 is made of a conductive metal material, such as Cu, Ni, Ti, Au, Ag, Pd, Pt, Fe, Cr, or SUS (stainless steel). Further, the shielding film 60 may be an alloy using some multiple materials of the aforementioned metal materials, or a laminated film using some multiple materials of the aforementioned metal materials. Furthermore, the shielding film 60 may be an alloy using any one of the aforementioned metal materials as a main material. In general, a SUS film is formed on (outside) a film formed using Cu as a main material.

Figure 3A:
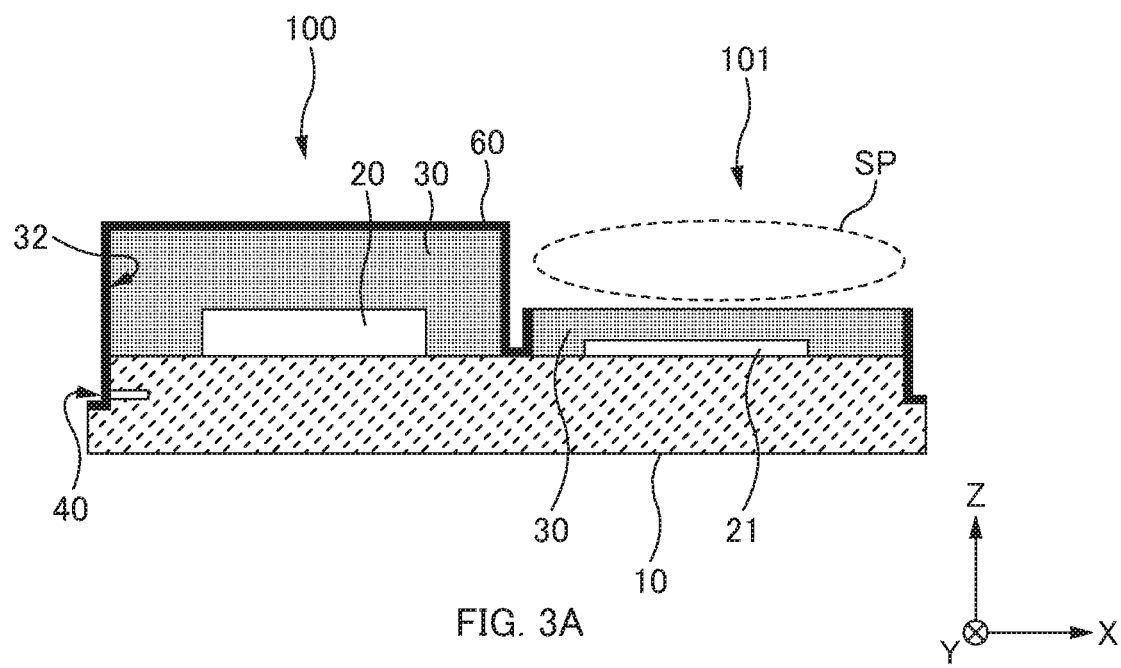
FIG. 3A is a schematic diagram illustrating an electronic component module according to a first embodiment where an antenna region is provided.
Figure 3B:
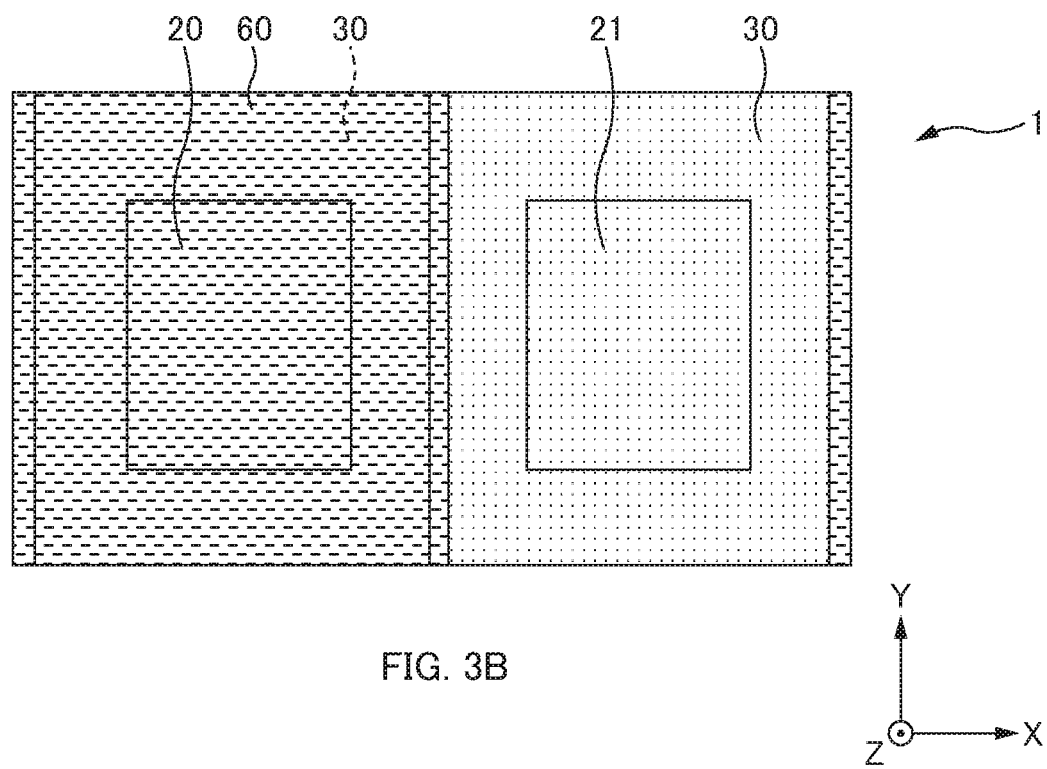
FIG. 3B is a schematic diagram illustrating an electronic component module according to a first embodiment where an antenna region is provided.

The above description has been made such that the electronic component 20 is provided on the upper surface side of the substrate 10, however, it is not limited thereto. For example, as illustrated in FIGS. 3A and 3B, a wireless region 100 where the electronic component 20 is disposed and an antenna region 101 where a wiring pattern serving as an antenna 21 may be provided on the upper surface of the substrate 10. Even in this case, the contact portion 40 is formed in the same manner as described above. That is, in this case, the removal portion 50 results in a space above the antenna. In other words, a space portion SP illustrated in FIG. 3A is a portion corresponding to a second groove 72 positioned above the antenna illustrated in FIG. 7C.

==Method of Manufacturing Electronic Component Module 1==

A method of manufacturing the electronic component module 1 including such a configuration will be described with reference to FIGS. 4A to 11. Here, the substrate 10, which is an example of a first insulating substrate, is included in the assembly substrate 15, which is an example of a second insulating substrate, and the substrate 10 indicates a substrate eventually obtained by singulation.

Figure 4A:
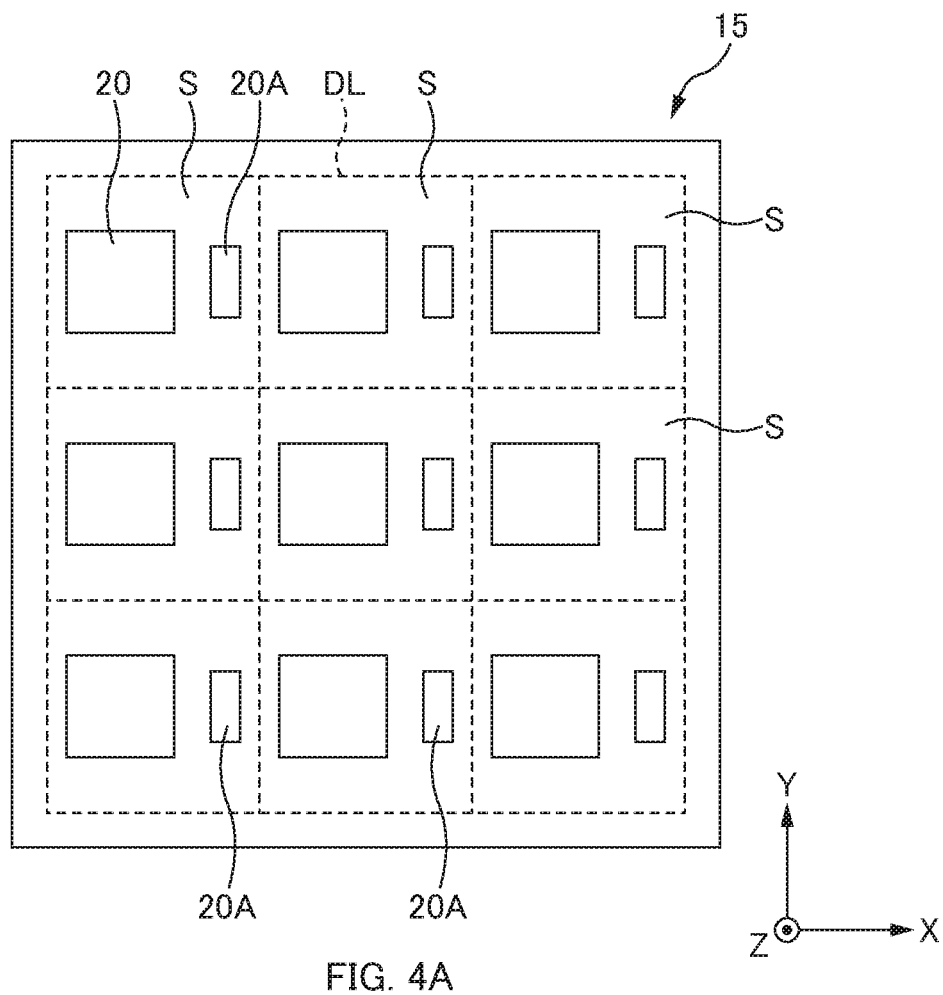
FIG. 4A is a schematic diagram illustrating a process of placing an electronic component on an assembly substrate, in a process of manufacturing an electronic component module of FIG. 1A.
Figure 4B:
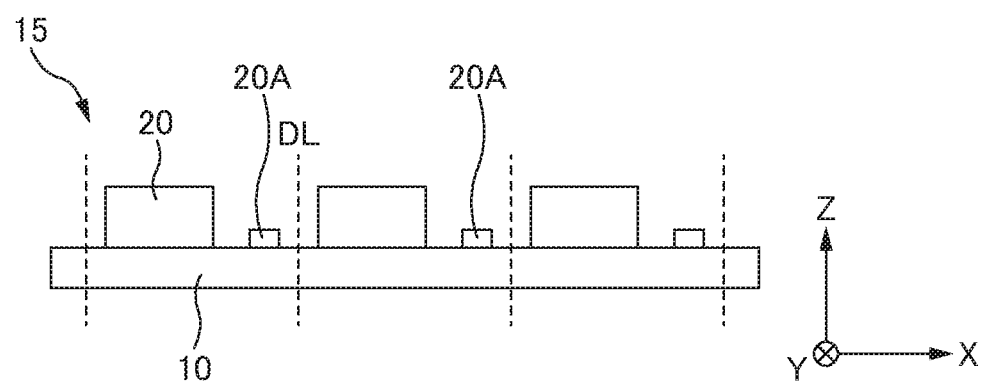
FIG. 4B is a schematic diagram illustrating a process of placing an electronic component on an assembly substrate, in a process of manufacturing an electronic component module of FIG. 1A.
Figure 5A:
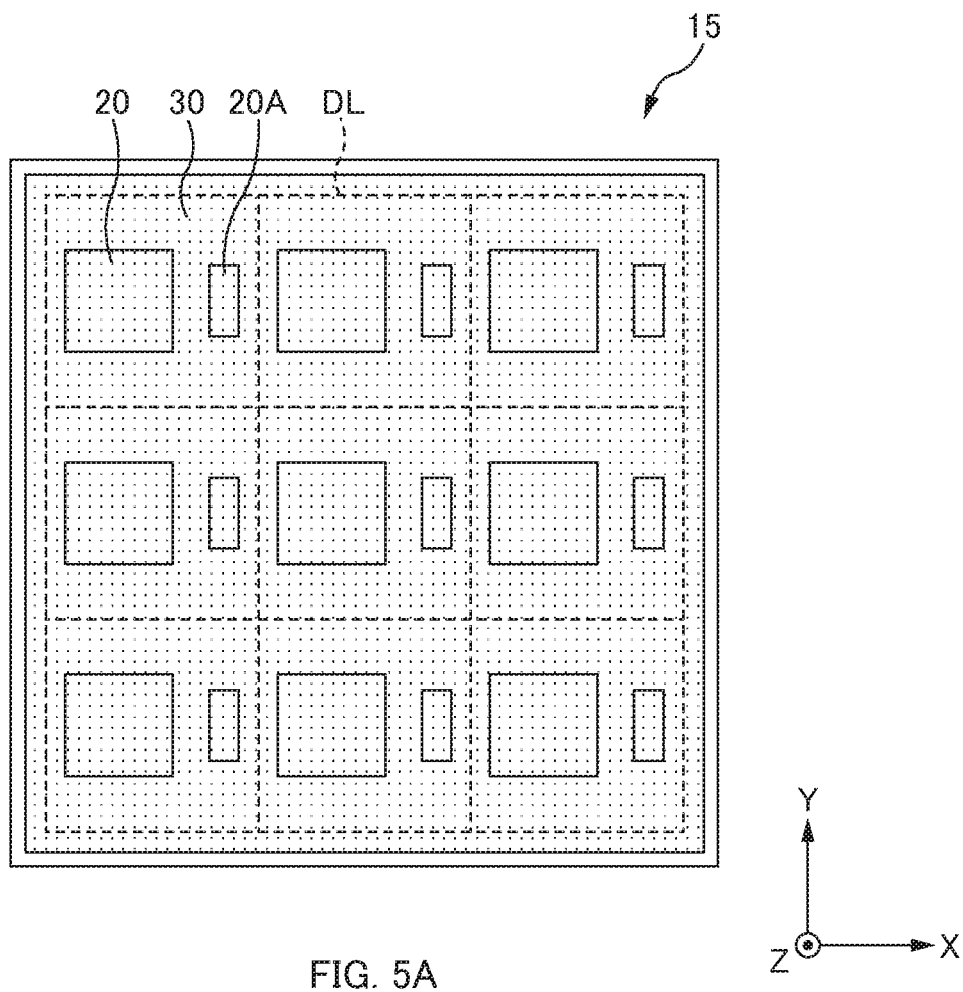
FIG. 5A is a schematic diagram illustrating a process of sealing an assembly substrate and electronic components with an insulating material, in a process of manufacturing an electronic component module of FIG. 1A.
Figure 5B:
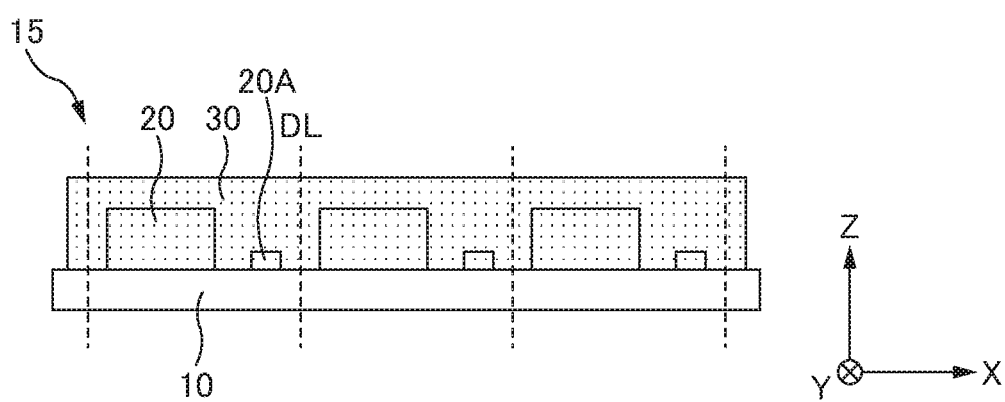
FIG. 5B is a schematic diagram illustrating a process of sealing an assembly substrate and electronic components with an insulating material, in a process of manufacturing an electronic component module of FIG. 1A.

First, the assembly substrate 15 (second insulating substrate) is prepared as in FIGS. 4A and 4B. The second insulating substrate 15 is formed such that a plurality of component mounting regions S, each of which the electronic component 20, 20A is disposed, is disposed on the substrate 10, and the second insulating substrate 15 includes a dicing line (dicing region) DL between the component mounting regions S adjacent to each other. Subsequently, as illustrated in FIGS. 5A and 5B, the sealing portion 30 is provided, which covers a surface, where the electronic components 20, 20A are provided, with an insulating material. The electronic component 20 is a tall component, while the electronic component 20A is a short component. For example, the electronic component 20 is an IC chip, and such electronic components 20A are a passive component, a chip capacitor, and/or the like. An IC chip and/or a package may be sealed independently, or electronic components other than them may be disposed. It should be noted that a space may be provided from the upper side to the lower side of the mounting portion of the electronic component 20A. Further, the sealing portion 30 may be formed such that sealing is performed using a thermosetting resin by transfer molding, sealing is performed using a thermoplastic resin by injection molding, and further sealing is performed with an insulating resin being printed by screen printing or being coated by potting.

Figure 6A:
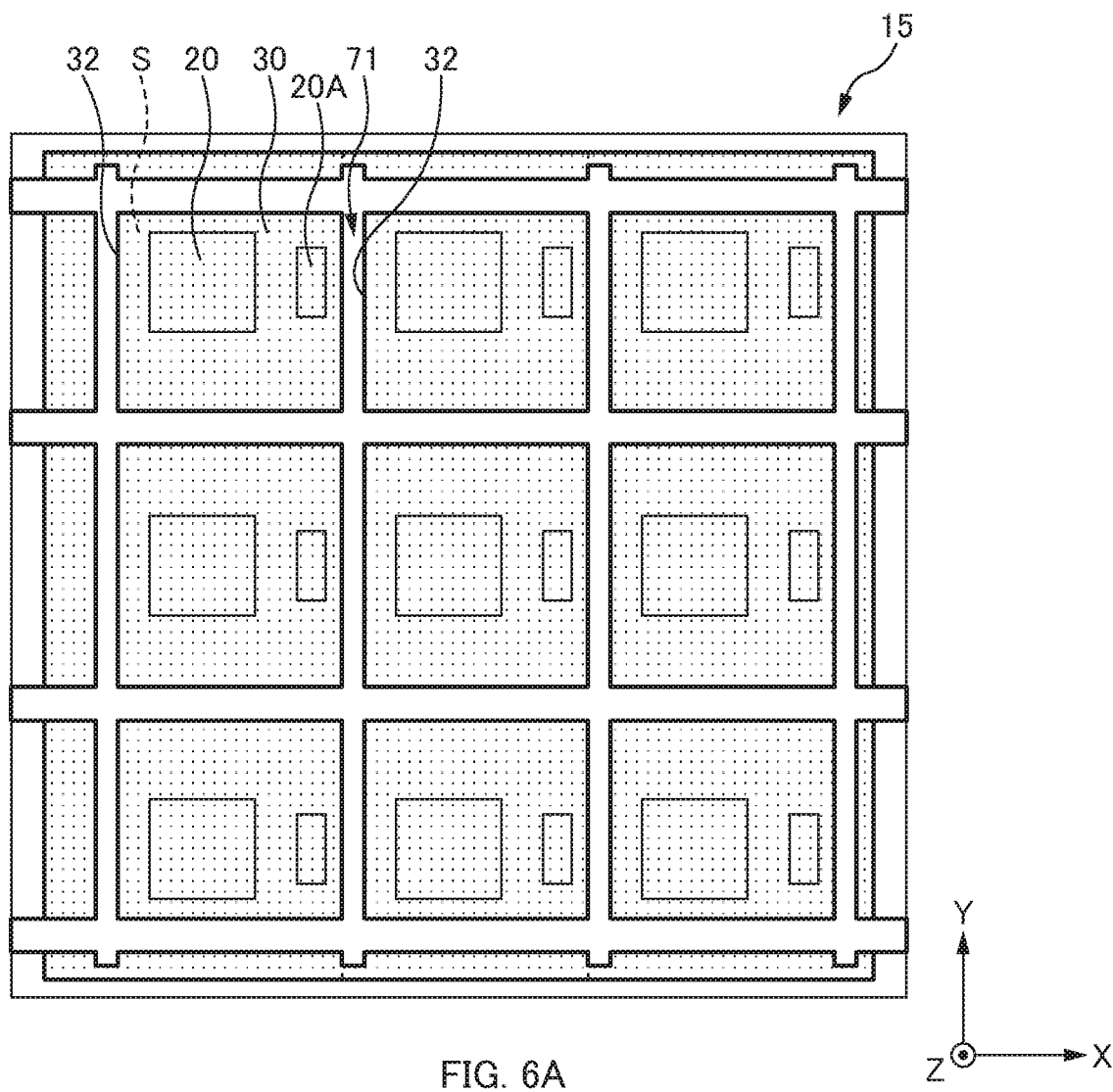
FIG. 6A is a schematic diagram illustrating a process of forming a first groove, in a process of manufacturing an electronic component module of FIG. 1A.
Figure 6B:
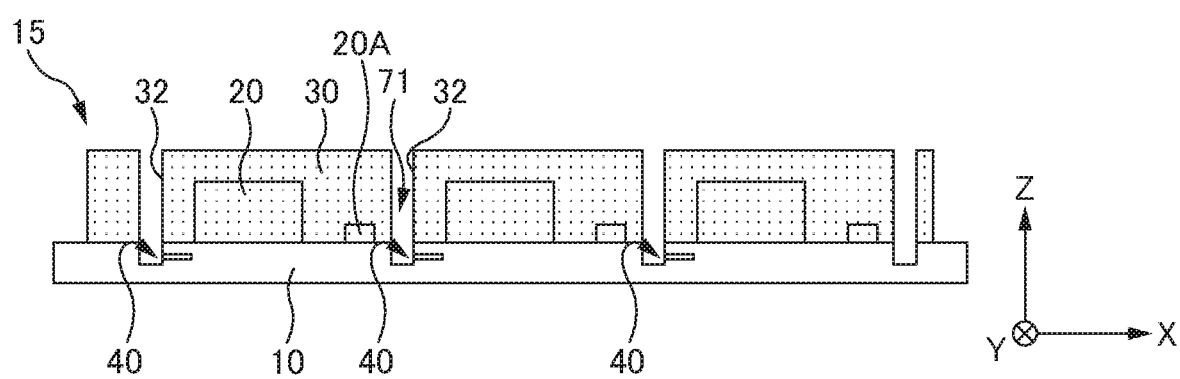
FIG. 6B is a schematic diagram illustrating a process of forming a first groove, in a process of manufacturing an electronic component module of FIG. 1A.

Next, as illustrated in FIGS. 6A and 6B, the dicing region DL is ground by a grinding apparatus (dicing apparatus) to form the groove 71 (first groove), such that the side surfaces 32 of the sealing portions 30 are formed so as to surround the component mounting regions S. In specific, dicing is performed from a surface of the sealing portion 30 to a surface of the substrate 10 or to an inner layer of the substrate, to form the first groove 71 such that the side surface of the substrate 10 is exposed. Accordingly, the contact portion 40 exposed on the side surface of the substrate 10 is formed. Note that this first groove, for example, having a width of about 350 μm and a depth of about 550 μm.

Figure 7A:
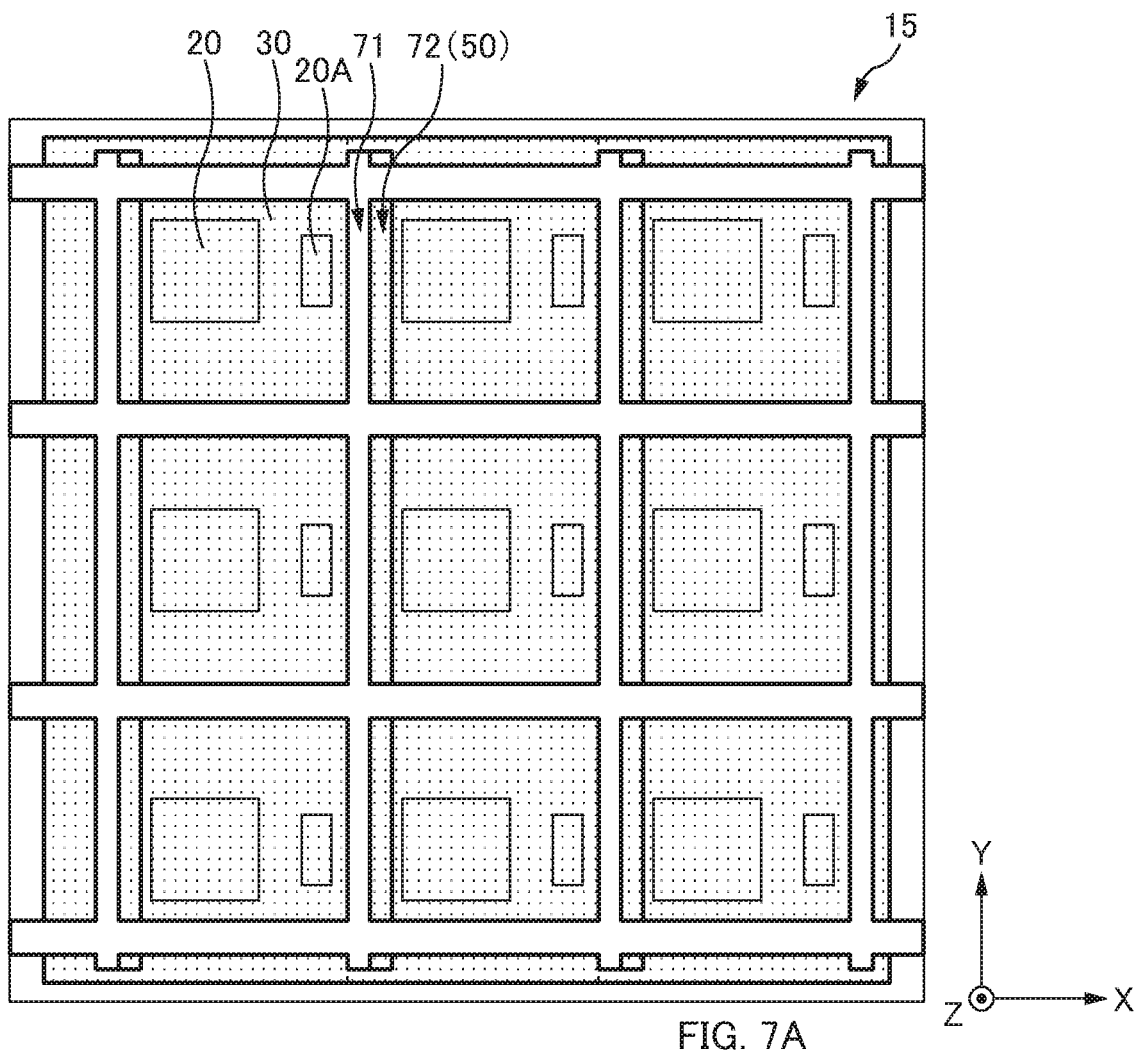
FIG. 7A is a schematic diagram illustrating a process of forming a second groove, in a process of manufacturing an electronic component module of FIG. 1A.
Figure 7B:
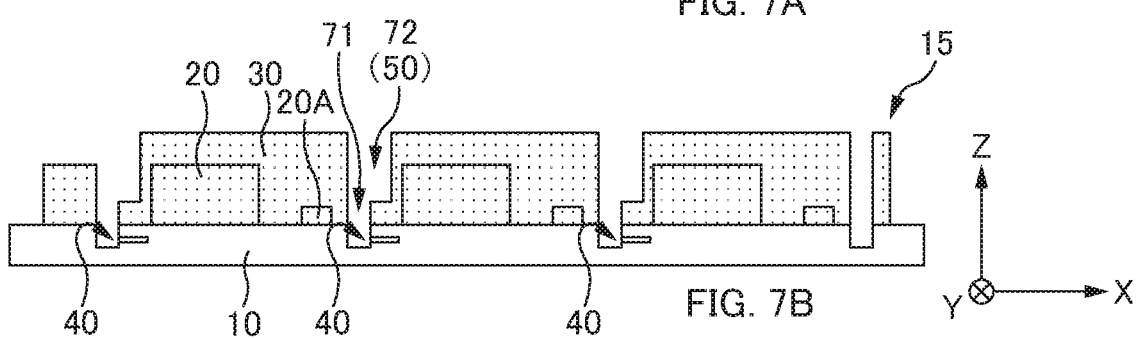
FIG. 7B is a schematic diagram illustrating a process of forming a second groove, in a process of manufacturing an electronic component module of FIG. 1A.
Figure 7C:
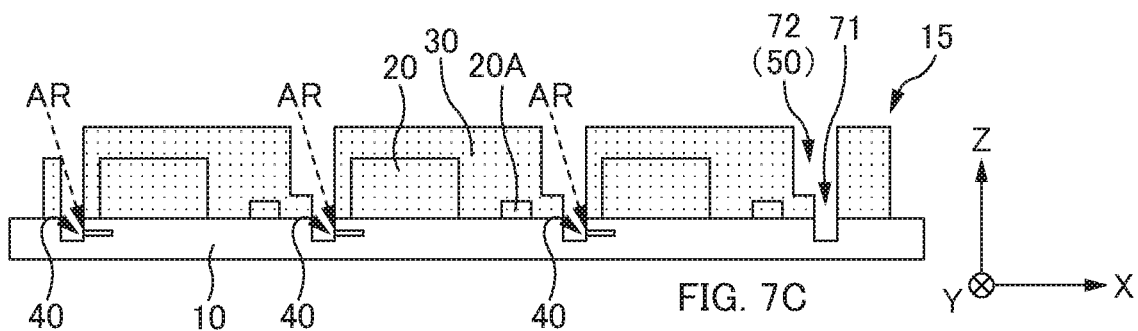
FIG. 7C is a schematic diagram illustrating a process of forming a second groove, in a process of manufacturing an electronic component module of FIG. 1A.
Figure 10:
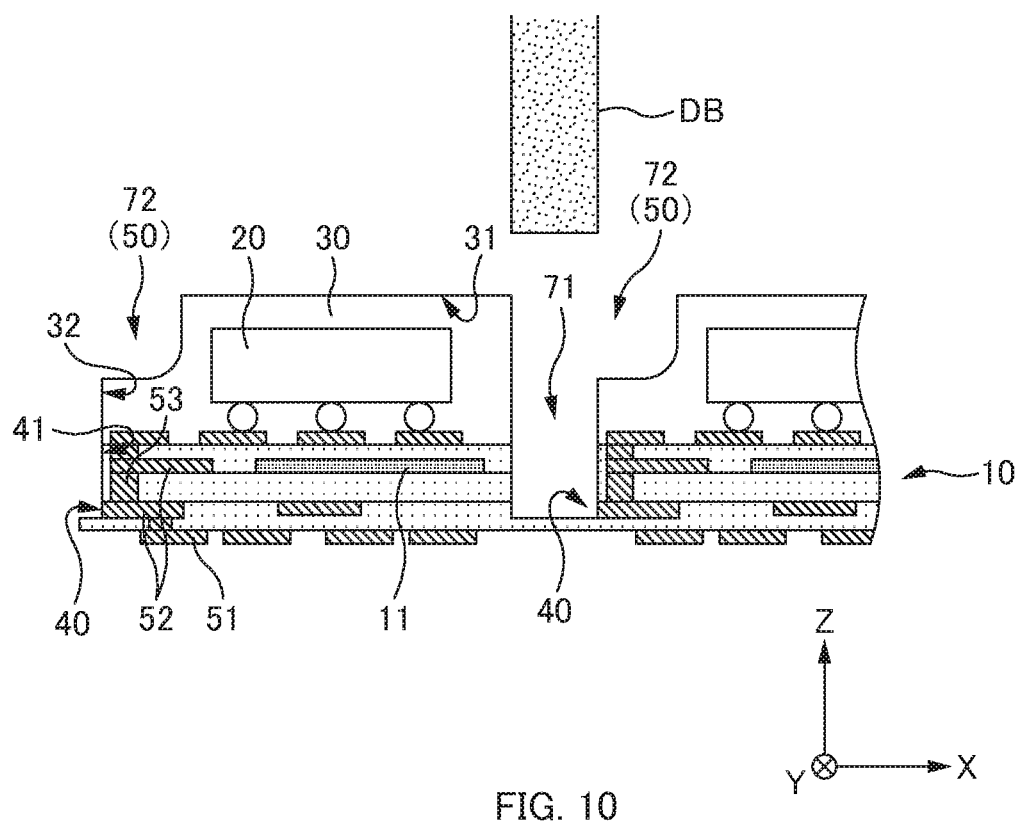
FIG. 10 is a diagram illustrating, in detail, a process of forming a first groove and a second groove shown in FIGS. 6B and 7B.

After the first groove 71 is formed, the second groove 72 (removal portion 50) is formed, as illustrated in FIG. 7B or 7C. As illustrated in FIG. 10, the second groove 72 (removal portion 50) is formed on the front surface 31 side of the sealing portion 30, so as to be continuous with the first groove 71, have a width equal to or greater than the width of first groove 71, and have a depth shallower than the first groove 71. As a result, in a downstream process, the shielding film 60 can be formed to have a sufficient film thickness on the side surface of a package, even in a case where intervals between packages on the assembly substrate 15 (i.e., a width of the first groove 71) is small.

Figure 8:
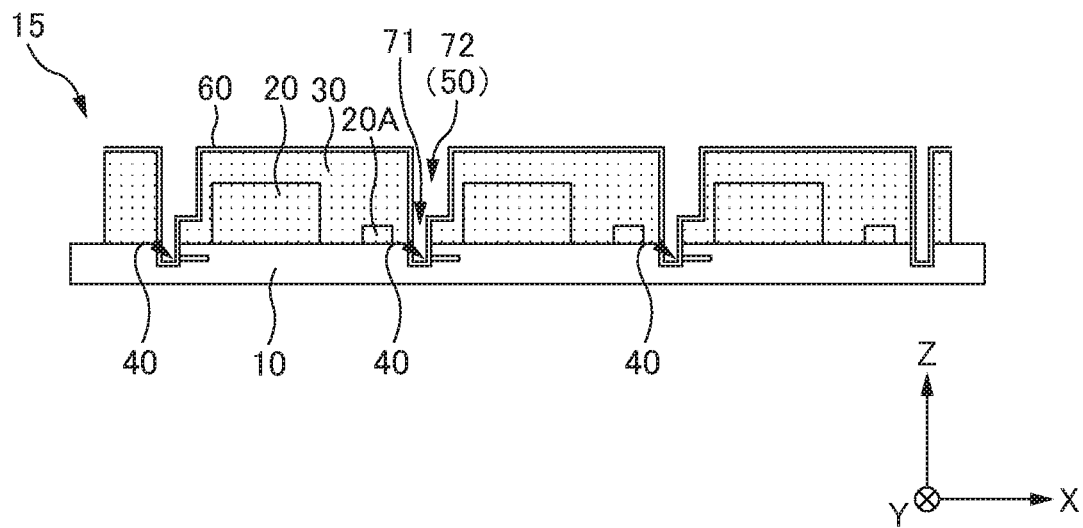
FIG. 8 is a schematic diagram illustrating a process of forming a shielding film, in a process of manufacturing an electronic component module of FIG. 1A.
Figure 11:
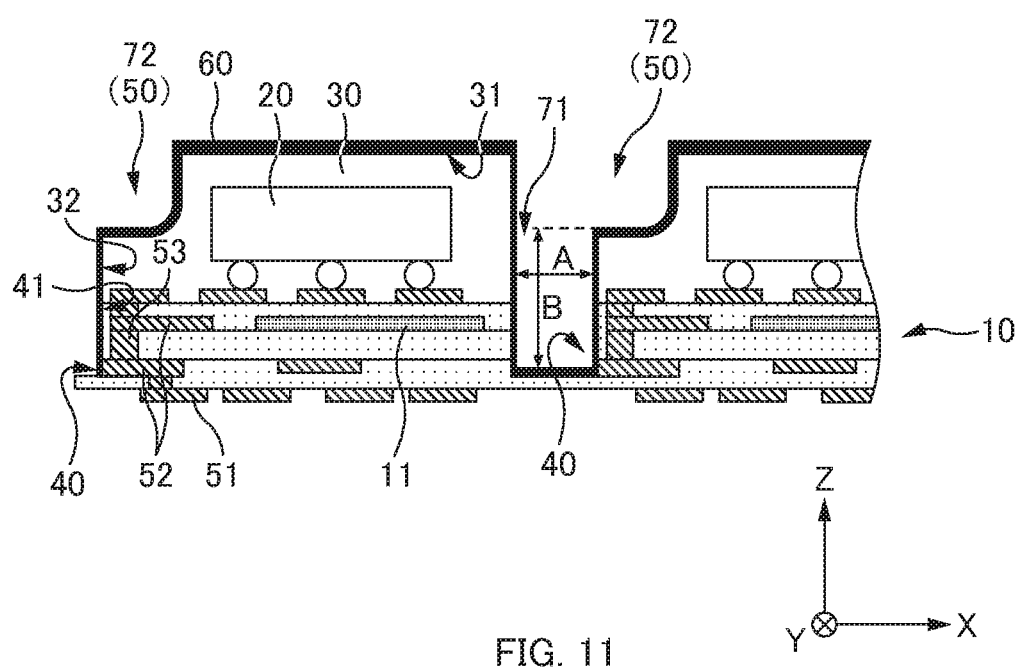
FIG. 11 is a diagram illustrating, in detail, a process of forming a shielding film shown in FIG. 8.

Then, as illustrated in FIG. 8, the shielding film 60 is formed, using a conductive material, on the upper surface 31 (front surface) and the side surface 32 of the sealing portion 30 in a vacuum atmosphere having a pressure lower than atmospheric pressure, by the vacuum film-forming method, such as vapor deposition, sputtering or CVD. On such an occasion, as illustrated in FIG. 11, a scattered conductive material is caused to pass through the second groove 72 (removal portion 50) in a low vacuum atmosphere, to form the shielding film 60 on a side surface of the substrate 10. Preferably, the second groove 72 is formed such that a length (distance) B of the side surface from the bottom surface of the first groove 71 to the bottom surface of the removal portion 50 is twice or smaller with respect to a width A of the first groove 71.

Figure 9:
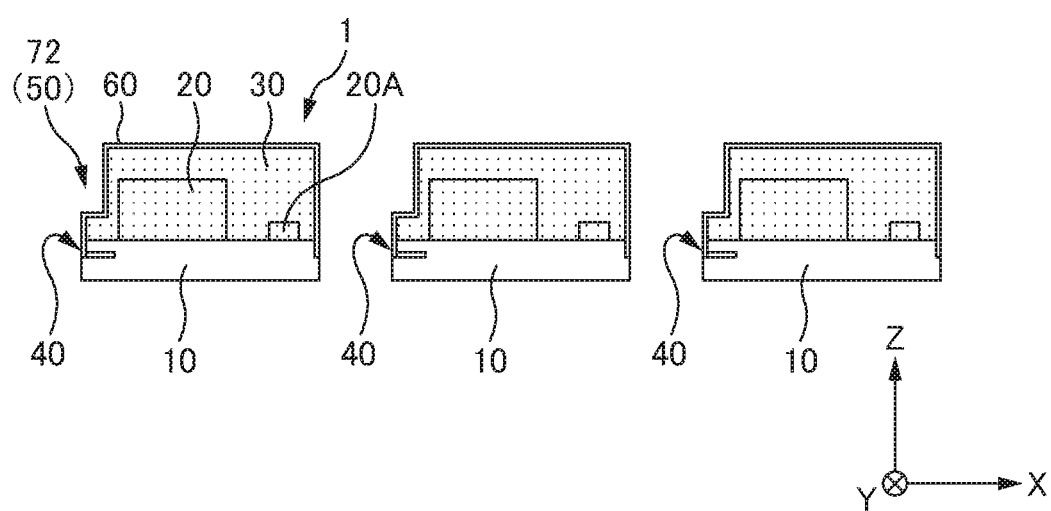
FIG. 9 is a schematic diagram illustrating a process of singulating electronic component modules, in a process of manufacturing an electronic component module of FIG. 1A.
Figure 18:
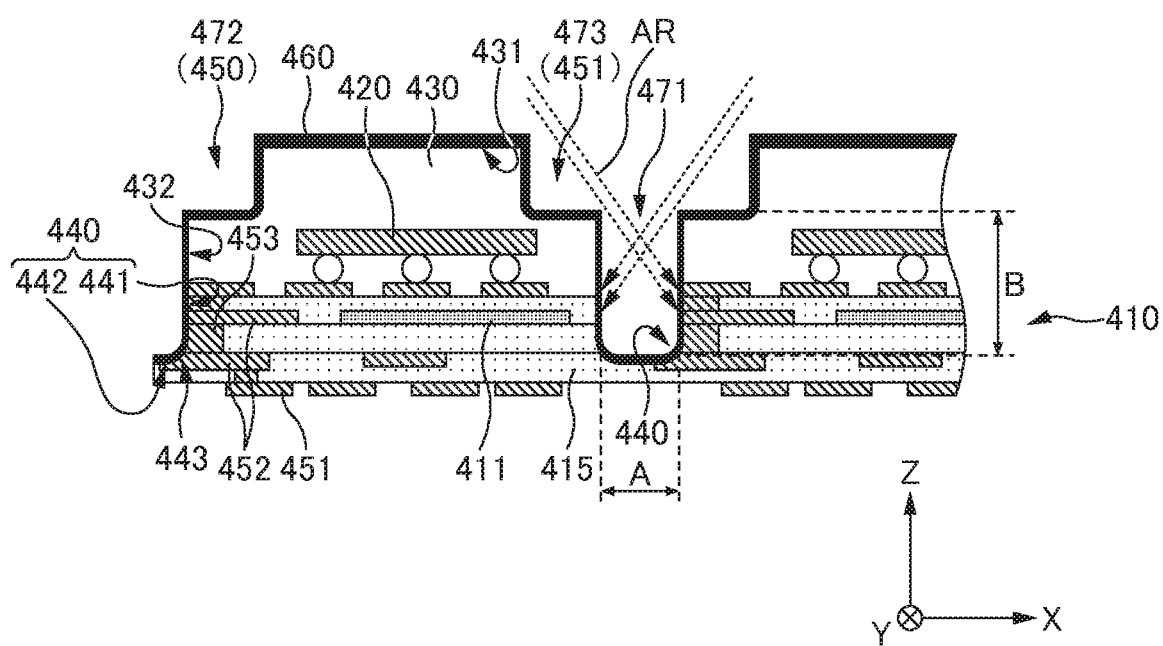
FIG. 18 is a diagram illustrating, in detail, a process of forming a shielding film, in a process of manufacturing an electronic component module of FIG. 16.

Finally, as illustrated in FIG. 9, the electronic component modules 1 are produced such that the dicing region DL is further ground to separate the assembly substrate 15, to obtain the singulated substrates 10 (first insulating substrate). Accordingly, when only the first groove 71 is formed using a commonly used dicing blade, as illustrated in FIG. 6B, and thereafter the shielding film 60 is formed by sputtering without the processes in FIGS. 7A to 7C, a width of the groove is small, resulting in a state where the amount of scattered matters reaching the contact portion 40 is small. According to the present disclosure, the second groove 72 can secure a floating space of these scattered matters, and further reduce the aspect ratio, thereby increasing the amount thereof reaching the contact portion 40. Here, a description will be simply given with reference to FIGS. 7B and 7C. An aspect of the present disclosure is to improve shielding metal adhesion to the contact portion 40 by virtue of the provision of the removal portion 50. The removal portion 50 may be positioned above the contact portion 40 as illustrated in FIG. 7B; positioned above the side surface opposite to the side surface where the contact portion 40 is provided as illustrated in FIG. 7C; or positioned on both sides as illustrated in FIG. 18. However, considering the characteristics of scattered matters of traveling in straight lines, such positioning as in FIG. 7C or in FIG. 18 is preferable. This is because, as indicated by arrows AR, the scattered matters are allowed to pass through the removal portion 50, to reach the contact portion 40. In this case, when seeing a cross section of the second groove 72, scattered matters are deposited such that a film thickness of a first side surface on the contact portion 40 side becomes greater than a second side surface opposed to the first side surface. Alternatively, the shielding film on the first side surface side has a deposited volume greater than the shielding film on the second side surface side.

Second Embodiment

Figure 12:
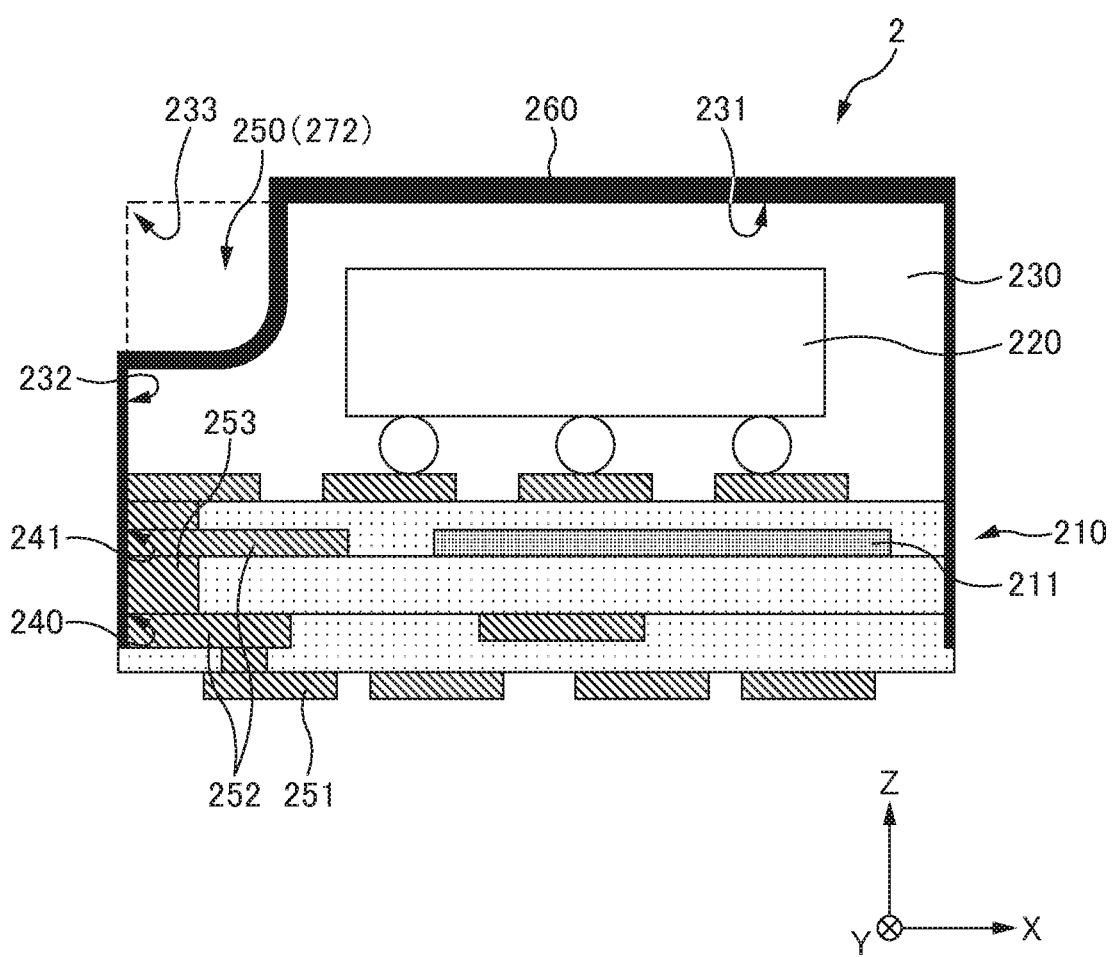
FIG. 12 is a schematic diagram illustrating an electronic component module according to a second embodiment.
Figure 13A:
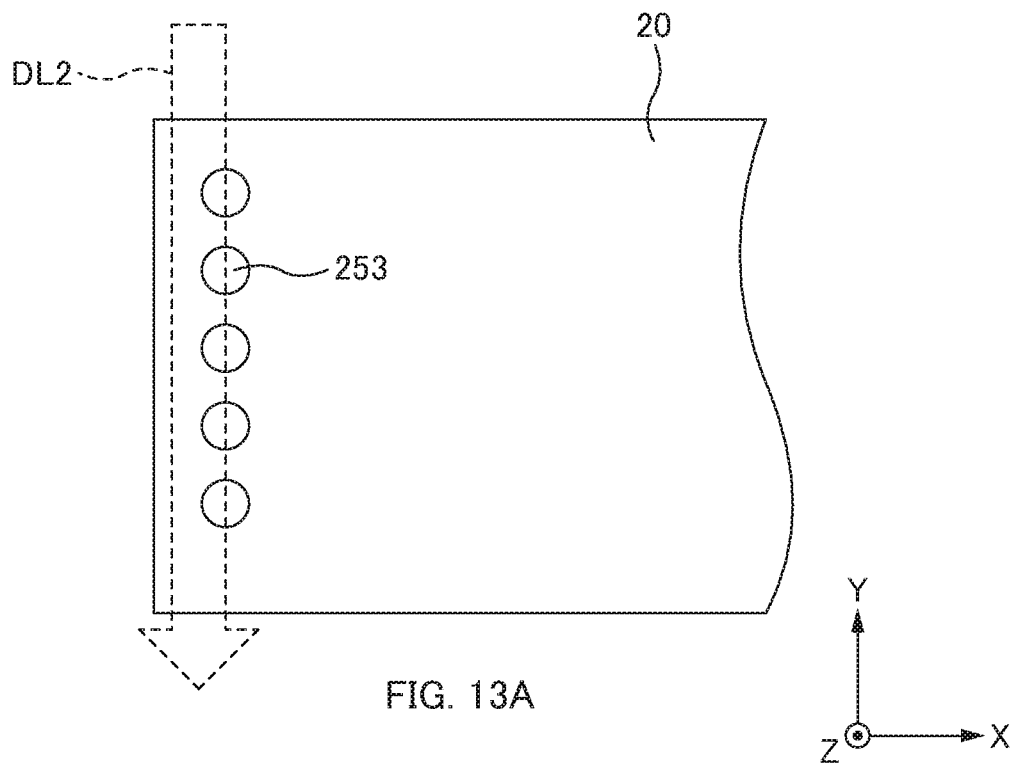
FIG. 13A is a diagram illustrating a positional relationship of vias (or through holes) formed inside an electronic component module of FIG. 12 when viewed from an upper surface side.
Figure 13B:
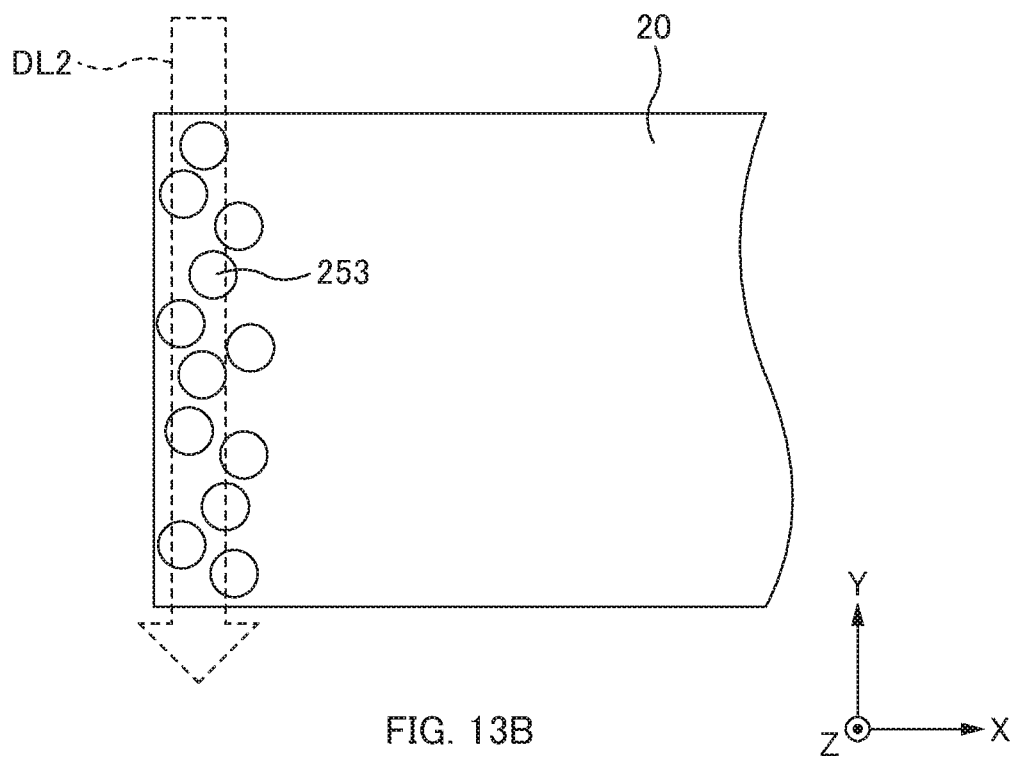
FIG. 13B is a diagram illustrating a positional relationship of vias (or through holes) formed inside an electronic component module of FIG. 12 when viewed from an upper surface side.

An electronic component module 2 according to a second embodiment will be described with reference to FIGS. 12 to 14. FIG. 12 is a schematic diagram illustrating the electronic component module 2 according to the second embodiment. FIGS. 13A and 13B are diagrams illustrating positional relationships of vias 253 (or through holes) formed inside the electronic component module 2 of FIG. 12 when viewed from the upper surface side. FIGS. 14A and 14B are schematic diagrams illustrating the electronic component module 2 according to the second embodiment in which a solid ground 254 extending from the vicinity of an upper side 51 to the vicinity of a lower side S2, in the drawing, of a substrate 210 is used as an electrode 252 in an inner layer.

The electronic component module 2 according to the second embodiment includes the substrate 210, an electronic component 220, a sealing portion 230, a contact portion 240, a removal portion 250 and a shielding film 260, similarly to the first embodiment. However, the electronic component module 2 according to the second embodiment is different from the electronic component module 2 according to the first embodiment in that the contact portion 240 is formed including the via 253, a through hole, or the solid ground 254 (the solid ground indicates here that, for example, all, substantially all, or a half of a surface of a layer in a printed-circuit board is convered with GND metal. This can strengthen and solidify ground (GND)). Thus, in the following description, the contact portion 240 will be described.

The contact portion 240 includes a vertical surface formed with the electrode 252 and/or the via 253 exposed by dicing. Further, the contact portion 240 is electrically connected with a terminal 251 and/or a conductive pattern 211. The contact portion 240 may include at least one of the electrode 252, the via 253, or a through hole. That is, as illustrated in FIGS. 13A and 13B, the contact portion 240 is formed when a dicing line DL2 is formed so as to overlap with the electrode 252, the via 253, or a through hole. In other words, the vias 253 are disposed, as illustrated in FIGS. 13A and 13B, so as to overlap with the dicing line DL2 when viewed from the upper surface side. That is, the contact portion 240 is configured to be electrically connected to the GND, for example, through the terminal 251 and/or the conductive pattern 211, via the electrode 252, the via 253 or a through hole, the contact area can be increased according to the number of the contact portion 240. Further, if the via 253 is the above-described solid ground, the contact area can be increased also.

A plurality of the vias 253 is provided. In FIG. 13A, the vias 253 are arranged in a row along the dicing line DL2, however, they may be provided so as to form a plurality of rows as illustrated in FIG. 13B. The vias 253 do not necessarily need to be regularly arranged, and may be irregularly (at random) arranged in the vicinity of the dicing line DL2. With such a configuration, even if the position of the dicing blade is displaced, one or some vias 253 (or through hole) coincide with the dicing line DL2, and the contact portion 240 can be formed.

In both cases of FIGS. 13A and 13B, by causing the plurality of the vias 253 to overlap with the dicing line DL2, the exposed area of a conductive portion such as the vias 253 exposed on the side surface of the electronic component module 2 is increased. Accordingly, the contact area between the conductive portion such as the via 253 and the shielding film 260, which will be describe later, is increased. Accordingly, the shielding film 260 is formed in the conductive portion such as the via 253, and thus it is possible to reduce contact resistance of the shielding film 260 in the contact portion 240.

Further, as illustrated in FIGS. 14A and 14B, the contact portion 240 may include the solid ground 254 in an inner layer of the substrate 210. It should be noted that the solid ground 254 is a ground electrode provided to a predetermined insulation layer in the substrate 20, to have a planar extent. Here, since the solid ground 254 extends from the upper side 51 to the lower side S2 in the drawing, the exposed area can be increased. This can reduce contact resistance of the shielding film 260 in the contact portion 240. For reference, FIG. 14B illustrates a relationship between the solid ground 54 and the dicing line DL2 when viewed from the upper surface. It should be noted that FIG. 14A illustrates the solid ground 254 as being provided to a front layer of the substrate, however, the solid ground 254 may be provided in an inner layer or on a back surface of the substrate 210.

Third Embodiment

Figure 15:
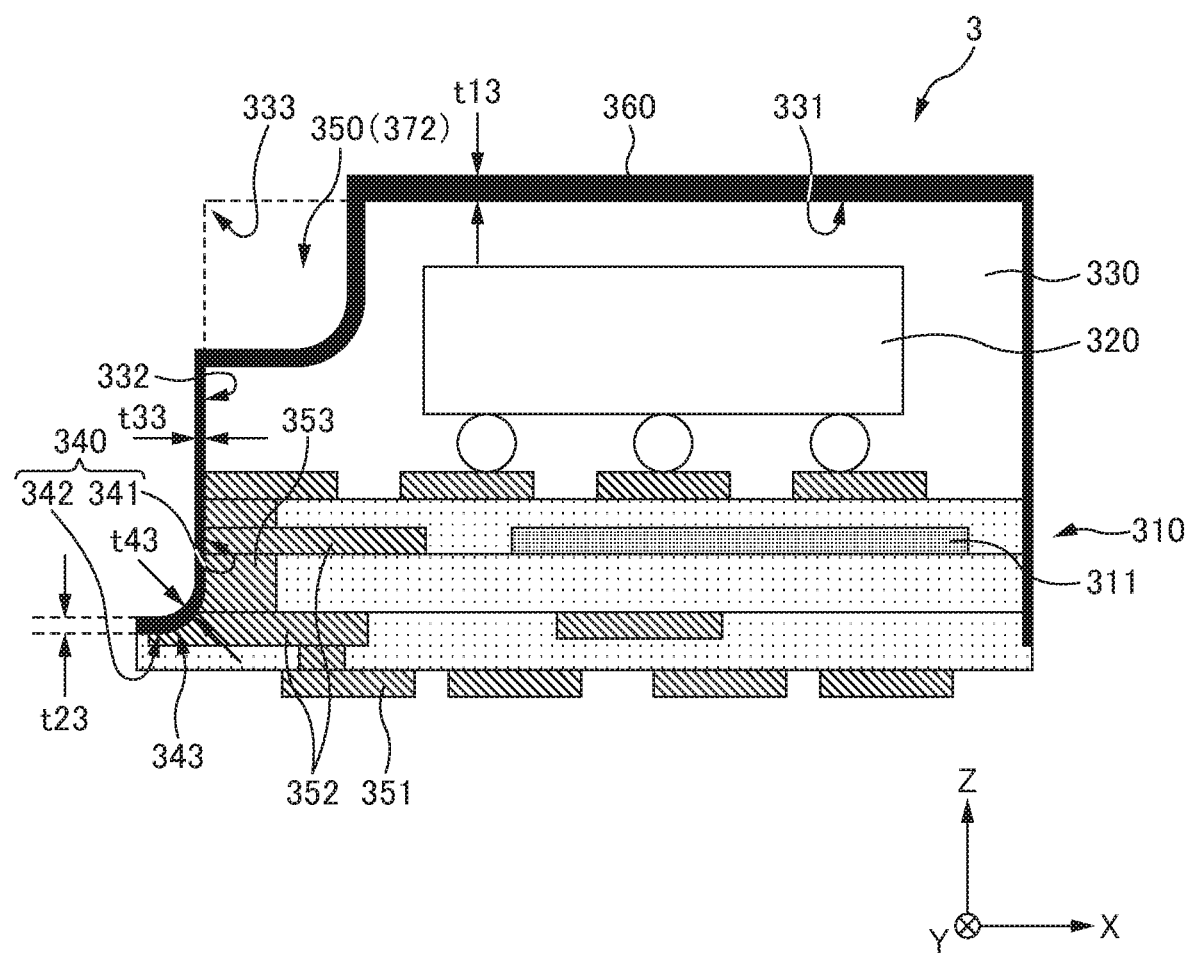
FIG. 15 is a schematic diagram illustrating an electronic component module according to a third embodiment.

An electronic component module 3 according to a third embodiment will be described with reference to FIG. 15. FIG. 15 is a schematic diagram illustrating the electronic component module 3 according to the third embodiment.

The electronic component module 3 according to the third embodiment includes a substrate 310, an electronic component 320, a sealing portion 330, a contact portion 340, a removal portion 350 and a shielding film 360, similarly to the first and second embodiments. However, the electronic component module 3 according to the third embodiment is different from the electronic component modules 1 and 2 according to the first and second embodiments in that the contact portion 340 includes a vertical surface and a horizontal surface that are formed with an electrode 352 and a via 353 exposed by dicing. Thus, in the following description, the contact portion 340 will be described.

The contact portion 340 is a portion having a vertical surface and a horizontal surface that are formed with the electrode 352 and the via 353 exposed by half-cut dicing the substrate 310. Further, the contact portion 340 may include at least one of the electrode 352, the via 353, or a through hole. Further, the contact portion 340 may include a solid ground (not illustrated).

The electrode 352, the via 353, a through hole, and/or a solid ground is exposed, by dicing, on the sealing portion 330. In this state, the contact portion 340 includes a vertical surface 341 (surface parallel to YZ plane) of the substrate 310 continuous with a side surface 332 of the sealing portion 330, and a horizontal surface 342 (surface parallel to XY plane) of the substrate 310 continuous with this vertical surface 341. A curved surface 343 lies between the vertical surface 341 and the horizontal surface 342. The curvature of a curve in the curved surface 343 varies with the degree of sharpness (wear-out) of a blade of the cutting apparatus that was used. However, it is desirable to satisfy the relationships of film thicknesses of the shielding film 360 which will be described later.

As can be applied in all the following embodiments, a portion corresponding to the horizontal surface 342 of the contact portion 340 may be a burr produced in the bottom surface when dicing. In FIG. 15, dicing is stopped half way in the thickness direction of the substrate 310 such that the via 353 and the electrode 352 are exposed on the horizontal surface 342. However, when swarf, so-called burr, of the via 353 or the electrode 352 positioned on the lower side remains in the horizontal surface 342 integrally with the electrode 352 even after shaving (grinding) has been completely finished, the shielding film 360 may be deposited on this burr. Further, cutting on the dicing line may be performed by laser processing. Such cutting may be performed also by waterjet process, and this implements formation of a groove.

The above-described film forming method has such features that, for example, on the basis of the result of film formation by sputtering, a thick film is formed on the horizontal surface 342, while a thinner film is formed on the vertical surface 341 as compared with on the horizontal surface 342. Further, on the vertical surface 341, a film is formed thinner toward the –Z-direction. In view of such features of the film forming method, by exposing the electrode 352 or the like on the horizontal surface 342 of the contact portion 340, the shielding film 360 can be formed to be relatively thick thereon. Further, the shielding film 360 is formed to be thicker also on a curved portion 343 than on the vertical surface 341 (further, thinner than on the horizontal surface 342). This can reduce contact resistance between the contact portion 340 and the shielding film 360, thereby enhancing effects of suppressing EMI by virtue of the shielding film 360.

Here, it is preferable that thicknesses of the shielding film 360 in various parts are in the following relationship. That is, a relationship of t13>t33 and further a relationship of t23>t33 or t43>t33 are satisfied, where t13 is a film thickness of the shielding film 360 on the upper surface 331 of the sealing portion 330, t23 is a film thickness of the shielding film 360 on the horizontal surface 342 of the contact portion 340, t33 is a film thickness of the shielding film 360 on the side surface 332 of the sealing portion 330, and t43 is a film thickness of the shielding film 360 on the curved surface 343 of the contact portion 340. This is because, particularly, the scattered particles by vapor deposition, sputtering, or the like under low vacuum have the characteristics of traveling in straight lines. Thus, with the curved portion and horizontal portion, it is possible to ensure the thickness of the shielding film, reduce contact resistance, and further enhance adhesion.

Fourth Embodiment

Figure 16:
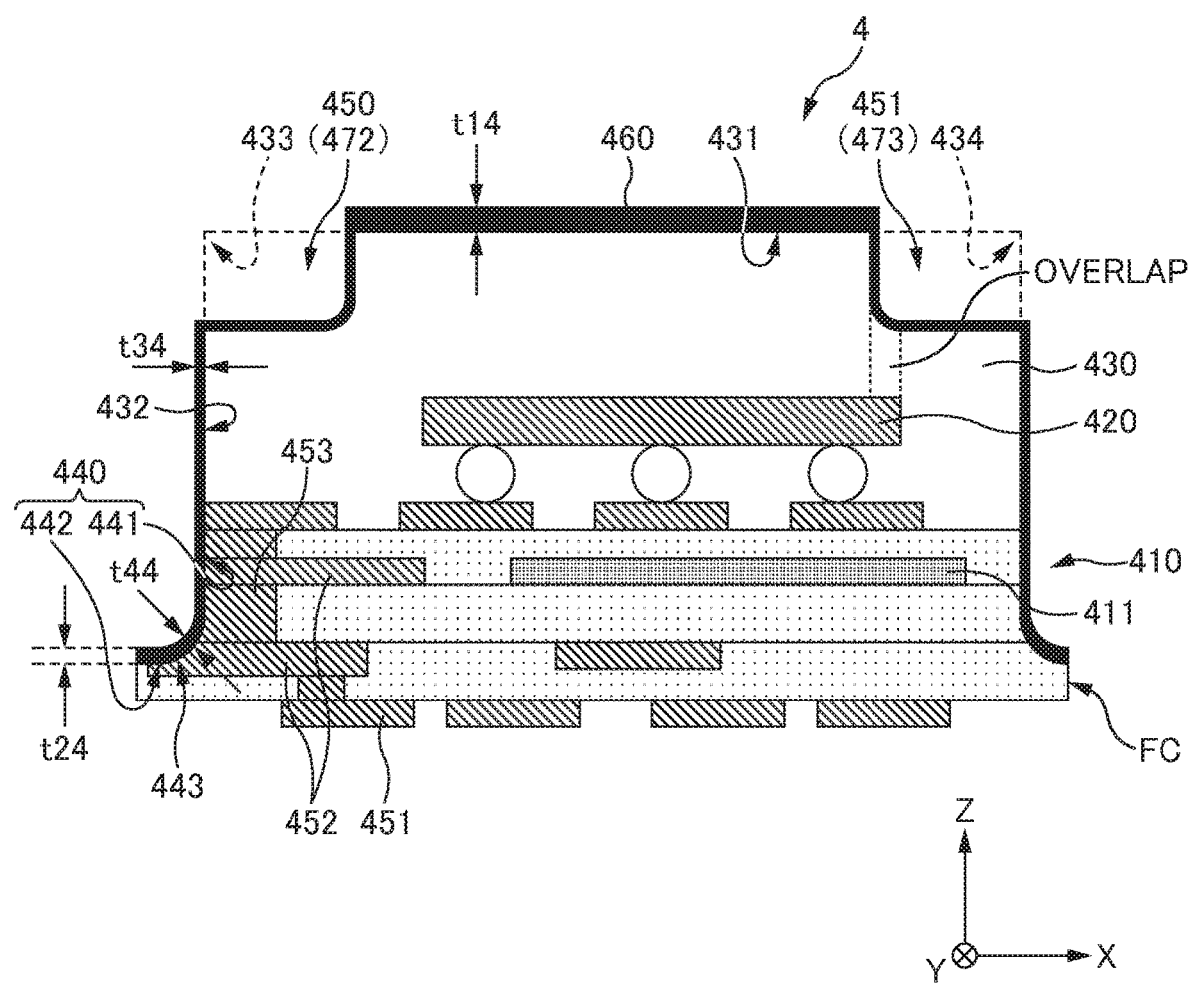
FIG. 16 is schematic diagram illustrating an electronic component module according to a fourth embodiment.
Figure 17:
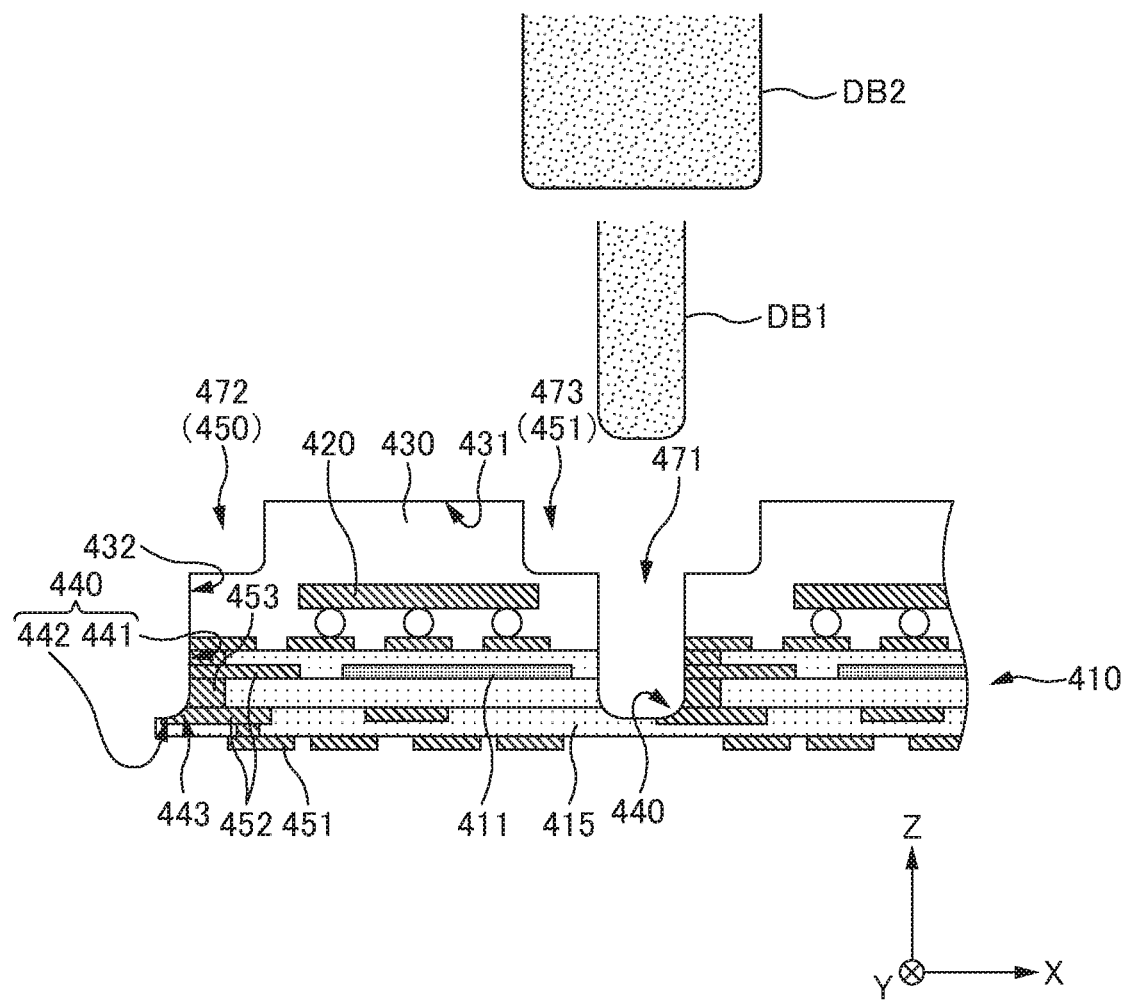
FIG. 17 is a diagram illustrating, in detail, a process of forming a first groove and a second groove, in a process of manufacturing an electronic component module of FIG. 16.

An electronic component module 4 according to a fourth embodiment will be described with reference to FIGS. 16 to 18. FIG. 16 is a schematic diagram illustrating the electronic component module 4 according to the fourth embodiment. FIG. 17 is a diagram illustrating, in detail, the process of forming a first groove 471, a second groove 472 (removal portion 450), 473 (removal portion 451), in a process of manufacturing the electronic component module 4 of FIG. 16. FIG. 18 is a diagram illustrating, in detail, a process of forming a shielding film 460 in the process of manufacturing the electronic component module 4 of FIG. 16.

The electronic component module 4 according to the fourth embodiment includes a substrate 410, an electronic component 420, a sealing portion 430, a contact portion 440, the removal portion 450, and the shielding film 460, similarly to the first to third embodiments, and further includes the removal portion 451. The removal portion 451 is formed at an edge 434 on the side opposite to the removal portion 450, as illustrated in FIGS. 16 and 17.

The removal portion 451 is formed, for example, on a side surface opposed to a vertical surface where the contact portion 440 is formed. That is, when describing with reference to FIG. 17, the first groove 471 is formed using a first blade DB1, and subsequently, the second groove 473 having a width greater than the first groove 471 is formed using a second blade DB2, thereby being able to form the removal portion 451. Accordingly, as illustrated in FIG. 18, more metal particles by sputtering having the characteristics of traveling in straight lines can enter the bottom portion of the first groove 471, as compared with a case where only the removal portion 450 is provided, and thus a film can be formed to be thicker with respect to the contact portion 440.

It is preferable that the removal portion 451 is formed, as illustrated in FIG. 18, such that a length (distance) B of the side surface from the bottom surface of the first groove 471 to the bottom surface of the second groove 473 (removal portion 451) is twice or smaller with respect to a width A of the first groove 471. Since the removal portion 451 is formed as such, it is possible that more scattered particles of a conductive material can be allowed to pass through a space (region) formed by the removal portion 451, in the process of forming the shielding film 460. In particular, scattered matters indicated by arrows AR pass through the removal portion 451 of an electronic component module on the left side, and travel to the contact portion 440 of an electronic component module on the right side. Thus, there is an advantage that the deposition rate of scattered matters can be increased.

It is preferable that at least one of the removal portions 450, 451 is formed vertically above the electronic component 420 (see FIG. 16). That is, it is preferable that at least one of the removal portions 450, 451 is arranged to overlap with all or a part of the electronic component 420 when seeing from the upper surface side. With such an arrangement being employed, it becomes possible to reduce the size and cost of the electronic component module 4.

Further, in order for at least a part of the removal portions 450, 451 to reduce the size and cost of the electronic component module 4, it is considered that the electronic component 420 having a low height (a length in the Z-axis direction) is disposed in the vicinity of the outer periphery (side surface 432) of the electronic component module 4. Further, this can be achieved without using extra space, if a chip resistor and/or a chip capacitor having a height lower than the electronic component 420 is disposed in the vicinity of the periphery of a substrate and at least a part of an upper surface thereof results in the removal portion 451 constituted by the second groove 473.

Summary

According to an embodiment of the present disclosure, it becomes possible to form the shielding film 60 (260, 360, 460) in a state of an assembly substrate. Thus, rearrangement and tape fixing of semiconductor packages, in a case where film formation is performed after singulation, is unnecessary. Further, it is possible to reduce manufacturing cost since productivity is enhanced. Further, there is no wraparound of a film forming material to the back side of the substrate 10 (210, 310, 410), as in the case where film formation is performed after singulation, thereby improving quality and yields. In specific, singulation is performed by cutting at a portion indicated by a sign FC, after attachment of the shielding film. Thus, as illustrated in FIG. 16, the shielding film 460 is not formed, particularly, in the vicinity of FC and the back side thereof.

Further, it is preferable that the removal portion 50 (250, 350, 450, 451) is formed above the electronic component 20 (220, 320, 420). With such an arrangement being employed, it is possible to reduce the size and cost of the electronic component module 1, 2, 3, 4.

Further, the contact portion 340, 440 is configured to be electrically connected with the conductive pattern 311, 411, and the contact portion 340, 440 has the vertical surface 341, 441 continuous with the side surface 332, 432 of the sealing portion 330, 430, and the horizontal surface 342, 442 continuous with the vertical surface 341, 441. With provision of the horizontal surface 342, 442, it is possible to reduce contact resistance between the contact portion 340, 440 and the shielding film 360, 460.

Further, the contact portion 240, 340, 440 is configured to be electrically connected with the conductive pattern 211, 311, 411, and includes at least one of the electrode 252, 352, 452 provided to a surface layer or an inner layer of the substrate 210, 310, 410; the via 253, 353, 453 provided so as to connect between the electrode 252, 352, 452 and a layer thereabove or a layer therebelow, or between the layers; or a through hole provided to an upper layer or a lower layer with respect to the electrode 52, 252, 352, 452. According to such an embodiment, the contact area between the contact portion 240, 340, 440 and the shielding film 260, 360, 460 is increased, and thus contact resistance can be reduced.

Further, it is preferable that the electrode 252, 352, 452 of the contact portion 240, 340, 440 includes the solid ground 254. According to such an embodiment, the contact area between the contact portion 40 (140, 240, 340, 440, 540) and the shielding film 60 (160, 260, 360, 460, 560) is increased, and thus contact resistance can be lowered.

The plurality of vias 253, 353, 453 or through holes is provided at random or provided in a row, in a portion corresponding to the side surface 232, 332, 432 of the sealing portion 230, 330, 430. According to such an embodiment, it is easy to form the contact portion 240, 340, 440 to have the vias 253, 353, 453 or through holes when dicing is performed.

Further, it is preferable that the contact portion 340, 440 includes the curved surface 343, 443 between the vertical surface 341, 441 and the horizontal surface 342, 442. In such an embodiment, it is possible to secure a sufficient film thickness of the shielding film 360, 460. Thus, it is possible to reduce resistance of the shielding film 360, 460, as well as suppress the shielding film 360, 460 from peeling from the electronic component module 3, 4, which leads to enhancement of quality of the electronic component module 3, 4.

Further, it is preferable that $t13>t33$, $t14>t34$, and $t23>t33$, $t24>t34$ or $t43>t33$, $t44>t34$, where $t13$, $t14$ is a film thickness of the shielding film 360, 460 in the upper surface 331, 431 of the sealing portion 330, 430; $t23$, $t24$ is a film thickness of the shielding film 360, 460 in the horizontal surface 342, 442 of the contact portion 340, 440; $t33$, $t34$ is a film thickness of the shielding film 360, 460 in the side surface 332, 432 of the sealing portion 330, 430; and $t43$, $t44$ is a film thickness of the shielding film 360, 460 in the curved surface 343, 443 of the contact portion 340, 440. According to such an embodiment, it is easy to form the shielding film 360, 460 having a sufficient film thickness using a vacuum film forming technique such as vapor deposition, sputtering, or CVD. This leads to enhancement of productivity and quality of the electronic component module 3, 4.

The second groove 72 (272, 372, 472, 473) is formed such that a length of the side surface 32 (232, 332, 432) from the bottom surface of the first groove 71 (271, 371, 471) to the bottom surface of the second groove 72 (272, 372, 472, 473) is twice or smaller with respect to a width of the first groove 71 (271, 371, 471). According to such an embodiment, it is easy to form the shielding film 60 (260, 360, 460) having a sufficient film thickness using the vacuum film forming technique, such as vapor deposition, sputtering, or CVD.

Although embodiments of the present disclosure have been described above, the present disclosure is not limited thereto. The foregoing materials, shapes, and arrangements of components are merely embodiments for implementing the present disclosure, and can be variously changed without departing from the gist the disclosure.

What is claimed is:

1. An electronic component module comprising:
a substrate including a conductive pattern;
an electronic component provided to the substrate;
a sealing portion covering the electronic component and the substrate, the sealing portion having an upper surface and a side surface, the upper surface and the side surface forming an edge portion;
a contact portion configured to be electrically connected with the conductive pattern, the contact portion exposed on a vertical surface continuous with the side surface of the sealing portion;
a removal portion having a shape formed by removing the edge portion formed by the upper surface and the side surface of the sealing portion after the upper surface and the side surface of the sealing portion are exposed to an exterior to form the edge portion so that the removal portion eliminates the edge portion but leaves remaining portions of the upper surface and the side surface intact; and
a shielding film covering the remaining portions of the upper surface and the side surface, a surface formed by the removal portion, and the contact portion of the sealing portion
wherein the contact portion is configured to be electrically connected with the conductive pattern, and has the vertical surface continuous with the side surface of the sealing portion and a horizontal surface continuous with the vertical surface, and
wherein an electrode of the contact portion includes a solid ground.

2. An electronic component module according to claim 1, wherein the removal portion is formed above the electronic component.

3. An electronic component module according to claim 1, wherein
the substrate is a silicon interposer, and
a conductive pattern is formed, in an upper layer of a Si substrate, and is subjected to an insulating process using an inorganic insulation film.

4. An electronic component module according to claim 1, wherein the removal portion is formed on a side surface opposite to a side surface where the contact portion is formed.

5. An electronic component module according to claim 1, wherein
the contact portion includes at least one of
an electrode provided to a surface layer or an inner layer of the substrate,
a via provided so as to connect between the electrode and a layer thereabove or a layer therebelow, or between the layers, or
a through hole provided to an upper layer or a lower layer with respect to the electrode.

6. An electronic component module according to claim 5, wherein
the via includes a plurality of vias and the through hole includes a plurality of through holes, and
the plurality of vias or through holes is provided at random or provided in a row, in a portion corresponding to the side surface of the sealing portion.

7. An electronic component module according to claim 1, wherein the contact portion includes a curved surface between the vertical surface and the horizontal surface.

8. An electronic component module according to claim 7, wherein
$t1>t3$, and
$t2>t3$ or $t4>t3$,
where $t1$ is a film thickness of the shielding film in the upper surface of the sealing portion, $t2$ is a film thickness of the shielding film in the horizontal surface of the contact portion, $t3$ is a film thickness of the shielding film in the side surface of the sealing portion, and $t4$ is a film thickness of the shielding film in the curved surface of the contact portion.

9. An electronic component module, comprising:
a substrate including a conductive pattern;
an electronic component provided to the substrate;
a sealing portion covering the electronic component and the substrate, the sealing portion having an upper surface and a side surface, the upper surface and the side surface forming an edge portion;
a contact portion configured to be electrically connected with the conductive pattern, the contact portion exposed on a vertical surface continuous with the side surface of the sealing portion;
a removal portion formed by removing the edge portion formed by the upper surface and the side surface of the sealing portion; and
a shielding film covering the upper surface, the side surface and the contact portion of the sealing portion, wherein:
the substrate is provided with the conductive pattern, the substrate including a wireless region, where the electronic component is disposed, and an antenna region, where a wiring pattern serving as an antenna is disposed,
the electronic component is configured to be electrically connected with the conductive pattern, and is a wireless circuit component provided in the wireless region, and
the removal portion is positioned above the antenna region.

10. An electronic component module according to claim 9, wherein the removal portion is formed above the electronic component.

11. An electronic component module according to claim 9, wherein
the contact portion is configured to be electrically connected with the conductive pattern, and
the contact portion includes at least one of
an electrode provided to a surface layer or an inner layer of the substrate,
a via provided so as to connect between the electrode and a layer thereabove or a layer therebelow, or between the layers, or
a through hole provided to an upper layer or a lower layer with respect to the electrode.

12. An electronic component module according to claim 9, wherein the removal portion is formed on a side surface opposite to a side surface where the contact portion is formed.

13. An electronic component module according to claim 9, wherein the contact portion is configured to be electrically connected with the conductive pattern, and has the vertical surface continuous with the side surface of the sealing portion and a horizontal surface continuous with the vertical surface.

14. An electronic component module according to claim 13, wherein the contact portion includes a curved surface between the vertical surface and the horizontal surface.

15. An electronic component module according to claim 14, wherein:

t1>t3, and t2>t3 or t4>t3, where t1 is a film thickness of the shielding film in the upper surface of the sealing portion, t2 is a film thickness of the shielding film in the horizontal surface of the contact portion, t3 is a film thickness of the shielding film in the side surface of the sealing portion, and t4 is a film thickness of the shielding film in the curved surface of the contact portion.

16. A method of manufacturing an electronic component module, including preparing a second insulating substrate formed such that a plurality of component mounting regions, where electronic components are disposed, is disposed on a first insulating substrate, the second insulating substrate including a dicing region between the component mounting regions adjacent to each other, and a sealing portion covering, with an insulating material, a surface where the electronic component is provided, forming a first groove in the dicing region, to form a side surface of the sealing portion so as to surround the component mounting regions, forming a shielding film by forming a film, using a conductive material, on an upper surface and the side surface of the sealing portion in a vacuum atmosphere lower than an atmospheric pressure, and separating the second insulating substrate at the dicing region, the method comprising:

forming the first groove, through the sealing portion, in the first insulating substrate so as to expose a side surface of the first insulating substrate;

forming a second groove formed on the upper surface of the sealing portion so as to be continuous with the first groove, the second groove having a width greater than and having a depth shallower than the first groove; and forming the shielding film on the side surface of the first insulating substrate such that the conductive material is allowed to pass through the second groove in the low vacuum atmosphere.

17. A method of manufacturing an electronic component module according to claim 16, wherein the conductive material is formed by vapor deposition, sputtering or CVD.

18. A method of manufacturing an electronic component module according to claim 16, wherein the second groove is formed such that a length of the side surface from a bottom surface of the first groove to a bottom surface of the second groove is twice or smaller with respect to a width of the first groove.

* * * * *